United States Patent [19]

Sturges

[11] Patent Number: 5,490,266

[45] Date of Patent: Feb. 6, 1996

[54] PROCESS ORIENTED LOGIC SIMULATION HAVING STABILITY CHECKING

[75] Inventor: Jay J. Sturges, Orangevale, Calif.

[73] Assignee: Altera Corporation, San Jose, Calif.

[21] Appl. No.: 192,185

[22] Filed: Feb. 3, 1994

Related U.S. Application Data

[63] Continuation of Ser. No. 663,582, Mar. 1, 1991, abandoned.

[51] Int. Cl.$^6$ .................................................. G06F 11/26
[52] U.S. Cl. ........................ 395/500; 364/578; 364/802; 364/264.3; 364/DIG. 1; 371/71
[58] Field of Search .................................. 364/578, 862; 395/500; 371/71

[56] References Cited

U.S. PATENT DOCUMENTS

| | | | |
|---|---|---|---|
| 4,677,587 | 6/1987 | Zemany, Jr. | 364/900 |
| 4,725,975 | 2/1988 | Sasaki | 364/900 |
| 4,775,950 | 10/1988 | Terada et al. | 364/578 |
| 4,782,440 | 11/1988 | Nomizu et al. | 364/578 |
| 4,918,594 | 4/1990 | Onizuka | 364/200 |
| 4,918,643 | 4/1990 | Wong | 364/802 |
| 4,922,445 | 5/1990 | Mizoue et al. | 364/578 |
| 4,937,770 | 6/1990 | Samuels et al. | 364/578 |
| 4,945,503 | 7/1990 | Takasaki | 364/578 |
| 5,051,911 | 9/1991 | Kimura et al. | 364/468 |
| 5,051,941 | 9/1991 | Takamine | 364/578 |
| 5,053,980 | 10/1991 | Kanazawa | 364/578 |
| 5,062,067 | 10/1991 | Schaefer et al. | 364/578 |
| 5,081,601 | 6/1992 | Eirikasson | 364/578 |
| 5,384,720 | 1/1995 | Ku et al. | 364/578 |

Primary Examiner—Ken S. Kim
Attorney, Agent, or Firm—Townsend and Townsend and Crew

[57] ABSTRACT

A logic simulator for optimal configurability of combinatorial and sequential logic circuits in a simulated behavioral form. The present invention contains process oriented functional blocks with event posting to eliminate unnecessary evaluations in logic simulation. Also, the present invention manages a process to logic signal(s) and logic signal to process(s) sensitivity relationship(s) which reduces the traditional overhead of event scheduling and stabilization. The processing logic of the preferred embodiment is operably disposed within the random access memory and executed by the processor of a computer system. Upon activation of the present invention and initialization of all signals, a test is performed to determine if the logic network being simulated is in a stable condition. If the logic network is not stable, a loop is initiated for propagating signals and updating signal states throughout the logic network. Once the logic is propagated, the new state for all signals for which a state transition has occurred is set. Once the new states of signals have been set, a test is performed to determine if a new state has been encountered. A loop continues as long as signals transition to a new state. When a new state is not encountered, but the logic network has still not stabilized, a new state is forced and a new loop iteration is initiated. These loop iterations continue until the logic network stabilizes and simulation processing terminates.

13 Claims, 13 Drawing Sheets

PROCESS ORIENTED LOGIC SIMULATION HAVING STABILITY CHECKING

This is a continuation of application Ser. No. 07/663,582, filed Mar. 1, 1991 now abandoned

FIELD OF THE INVENTION

The present invention relates to the field of computer programs. Specifically, the present invention relates to logic simulation systems employing computer programs.

BACKGROUND OF THE INVENTION

Typically the most common method by which combinatorial and sequential logic simulations occur are by traversal of logic networks as represented in a logic schematic. Such logic schematics include electrical circuit diagrams. The actual implementation of logic being simulated dictates how the simulator will traverse and schedule events during stabilization of signals in the logic network. This prior art method typically involves evaluation and conformation of sensitive and non-sensitive signals associated with logic in a given logic network. Sensitive signals are those that are dependent upon or affected by another signal. In many instances, the entire logic network or logic circuit must be evaluated even though some non-sensitive signals do not contribute to the signals of interest. The prior art method allows optimization to occur only in actual circuit implementation or internal algorithmic methods of the simulator's stabilizing mechanism. Neither of these options takes full advantage of the simulation environment.

The external information presented to a prior art logic simulator includes a definition of a circuit and the events causing propagation of signals through the defined circuit. This information may be provided as shown in the following example:

Signals:
  Q, QBAR, S, R
Relationships:
  Q:=(S'* QBAR')',
  QBAR:=(R'* Q)'

In the above example, a functional sequential circuit is specified. As specified, the example logic circuit is sensitive to four signals: Q, QBAR, S, and R. Input signals 'S' and 'QBAR" will produce the product 'Q'. Input signals 'R' and 'Q' will produce the product 'QBAR'. Q and QBAR are generated by the prior art simulator whenever any of the sensitive factors or logic signals change state.

Given an instance where input signal 'S' is the only signal changing state (for example toggling from a logic 0 state to logic 1 state), only the product 'Q' needs to be computed by the simulator. Prior art systems, however group all four signals (Q, QBAR, S, and R) together. Thus, the prior art grouping of the sequential circuit contains unnecessary overhead.

To illustrate consider the following truth table:

| R | S | Q | QBAR | Q(t) | QBAR(t) |
|---|---|---|------|------|---------|
| 0 | 0 | 0 | 1    | 0    | 1       |
| 0 | 0 | 1 | 0    | 1    | 0       |
| 0 | 1 | 0 | 1    | 1    | 0       |
| 0 | 1 | 1 | 0    | 1    | 0       |
| 1 | 0 | 0 | 1    | 0    | 1       |
| 1 | 0 | 1 | 0    | 0    | 1       |
| 1 | 1 | 0 | 1    | 1    | 0       |
| 1 | 1 | 1 | 0    | 1    | 0       |

The truth table indicates signal dependencies and the relationships that may be optimized. In the prior art, the actual sequential logic under simulation is traced out and evaluated. All signal dependencies are propagated to reach the final resulting signal values. Thus, the traditional method is not efficient in optimizing for signal relationships.

Additionally, another problem exists in prior art logic simulators when modeling zero delay logic circuits or other circuits where the timing of signal state changes is critical. This problem is illustrated in the following examples.

Given a clocked sequential circuit, SR flipflop, as described below:

Signals:
  Q, S, QBAR, CLOCK
Relationships:
  Q:=((S * CLOCK)'* QBAR)'

In the above example, if the input signals 'S' and 'CLOCK' are active at the same instant in time, the product 'Q' will change state. This could possibly be valid in a real implementation as the input signal 'CLOCK' may require a zero or negative setup and hold condition on input signal 'S'. In that case, this level of precedence is still functionally valid without any constraints of a timing model imposed. However, if input signal 'CLOCK' requires 'S' to arrive before 'CLOCK' is active, an incorrect behavior will be simulated in the above example, without any timing models or other solution imposed. Thus, prior art simulators are unable to properly and conveniently model time critical signal dependencies.

Thus, it is an object of the present invention to provide a logic simulation system including optimal configurability of combinatorial and sequential logic circuits in a behavioral form. It is a further object of the present invention to provide a logic simulation system allowing external definability of possible events which trigger combinatorial and sequential logic propagation. It is a further object of the present invention to provide a logic simulation system that eliminates unnecessary evaluations. It is a further object of the present invention to provide a logic simulation system that efficiently models time critical signal dependencies.

SUMMARY OF THE INVENTION

The present invention provides a means and method for optimal configurability of combinatorial and sequential logic circuits in a simulated behavioral form. The present invention allows optimization(s) or control of the performance by which combinatorial and sequential logic simulations occur. At least two techniques contribute to the high efficiency. First, the present invention contains process oriented functional blocks with event posting to eliminate unnecessary evaluations. Second, the present invention manages process to logic signal(s) and logic signal to process(s) sensitivity relationship(s) which reduces the traditional overhead of event scheduling and stabilization.

The present invention allows external definability of possible events which trigger combinatorial and sequential logic propagation. Additionally, by virtue of external definition of when propagation of the circuit will occur, the present invention contains a process which manages event scheduling during stabilization of the circuit. All combinatorial internal logic of a process is evaluated in sequential order.

To manage the definition of process to sensitive signals and sensitive signal to processes, the present invention incorporates a process and data relations to maintain the expressed correspondence. The present invention stores the data in a form similar to a tree in representation where a base node or root is at the top of the tree.

The preferred embodiment of the present invention includes a computer system which comprises a bus for communicating information, a processor coupled to the bus for processing information, and a random access memory coupled to the bus for storing information and instructions for the processor. The processing logic of the preferred embodiment is operably disposed within the random access memory and, executed by the processor of the computer system. Within the processing logic of the preferred embodiment, several data structures are defined and used throughout the execution of the present invention. These data structures include a list of processes, a list of signals, and a list of process-to-signal relationships including a list of sensitive signals.

Upon activation of the present invention, the start state of all signals is initially set. Once the start state of all signals is set, a test is performed to determine if the logic network being simulated is in a stable condition. A stable network exists when either no signals are changing or when signals are changing in a predictable manner. If this is the case, then execution of the simulator may be terminated for this cycle at processing block 105. If the logic network is not stable, a loop is initiated for propagating signals and updating signal states throughout the logic network. Once the logic is propagated, the new state for all signals for which a state transition has occurred is set. Once the new states of signals have been set, a test is performed to determine if a new state has been encountered. A loop continues as long as signals transition to a new state. When a new state is not encountered, but the logic network has still not stabilized, a new state is forced and a new loop iteration is initiated. These loop iterations continue until the logic network stabilizes and simulation processing terminates.

DETAILED DESCRIPTION OF THE PREFERRED EMBODIMENT

Figure 1:
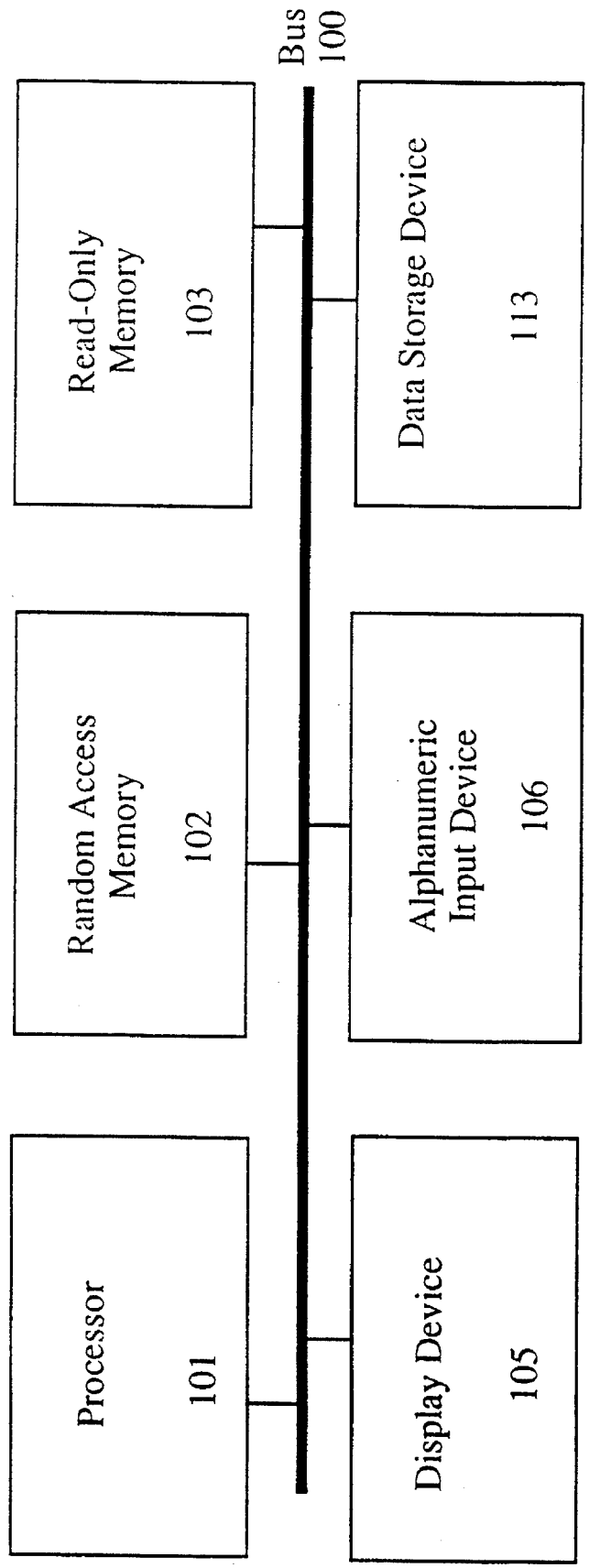
FIG. 1 is an illustration of the typical prior art computer system bus architecture.

The present invention provides a means and method for optimal configurability of combinatorial and sequential logic circuits in a simulated behavioral form. In the following description, numerous specific details are set forth in order to provide a thorough understanding of the invention. However, it will be apparent to one with ordinary skill in the art that these specific details need not be used to practice the present invention. In other instances, well-known logic structures, data structures, and interfaces have not been shown in detail in order not to unnecessarily obscure the present invention.

The present invention was formulated to provide an external capability of optimization(s) or control of the performance by which combinatorial and sequential logic simulations occur. The present invention is a method providing optimal configurability of combinatorial and sequential logic circuits in a behavioral form. Two techniques contribute to the high efficiency. First, the present invention contains process oriented functional blocks with event posting to eliminate unnecessary evaluations. Second, the present invention manages a process to logic signal(s) and logic signal to process(es) sensitivity relationship(s) which reduces the traditional overhead of event scheduling and stabilization.

The present invention allows external definability of possible events which trigger combinatorial and sequential logic propagation. These events can be optimally partitioned into multiple process definitions. Additionally, by virtue of external definition of when propagation of the circuit will occur, present invention contains a control means which manages event scheduling during stabilization of the circuit. All combinatorial internal logic of a process is evaluated in sequential order.

Referring to the sample logic definition presented above:

Signals:
  Q, QBAR, S, R
Relationships:
  Q:=(S'* QBAR')'
  QBAR:=(R'* Q)' the present invention can be used to optimize the simulation of the logic. Given that the function of both products 'Q' and 'QBAR' are evaluated as provided above, a more optimized solution may be illustrated in the following form:

```
process circuit_A
    is sensitive on QBAR, S
    begin
        Q := (S' * QBAR)')'
    end
process circuit _B
    is sensitive on Q, R
    begin
        QBAR := ((R' * Q)')'
    end
```

This form allows for a more optimal simulation. Since the computation of Q and QBAR has been partitioned into independent processes, a transition of S only produces a propagation of the product Q. Similarly, a transition of R only produces a propagation of the product QBAR. Thus, the present invention achieves a more efficient simulating time length.

Additionally, definition of process to sensitivity relationships allows a more directly controllable level of logic precedence as required in proper modeling of zero delay logic circuit simulations.

Given a clocked sequential circuit, SR flipflop, as described above:

Signals:

Q, S, QBAR, CLOCK
Relationships:
  Q:=((S * CLOCK)'* QBAR)'

To allow a level of precedence to occur without introduction of a timing delay or setup and hold information, an additional process would be defined. This process is described as follows:

```
process clock_delay
    is sensitive on CLOCK
    begin
        CLOCKD := CLOCK
    end
process S.EQ
    is sensitive on S
    begin
        SE := S
    end
process R.EQ
    is sensitive on R
    begin
        RE := R
    end
process circuit_A
    is sensitive on SE, QBAR, CLOCKD
    begin
        Q := ((SE * IS_RISING(CLOCKD))' * QBAR)'
    end
process circuit_B
    is sensitive on RE, Q, CLOCKD
    begin
        QBAR := ((RE * IS_RISING(CLOCKD))' * Q)'
    end
```

With the new definition of CLOCK, on the first round of the duty cycle in stabilization, if input signals 'CLOCK' and 'S' go active at the same instance, the product 'Q' would not realize a change of state. This now allows for definition of a positive timing setup and hold requirement without introduction of a timing model. Thus, functionally the circuit operates in simulation as would be realized in implementation.

To manage the definition of processes and process-to-sensitive-signal and sensitive-signal-to-process relationships, the present invention incorporates process and data relation information to maintain the expressed correspondence. The present invention stores the data in a form similar to a tree in representation where a base node or root is at the top of the tree. This root of the tree then spans out on branches or pages, that end in leafs where the data is stored. Means for maintaining information in a tree data structure is a technique well known to those of ordinary skill in the art.

The preferred embodiment of the present invention is implemented on a Sun Microsystems, Inc. brand computer system. It will be apparent to those with ordinary skill in the art, however, that alternative computer systems may be employed. In general, such computer systems, as illustrated by FIG. 1, comprise a bus 100 for communicating information, a processor 101 coupled with the bus for processing information, and a random access memory 102 coupled with the bus 100 for storing information and instructions for the processor 101. Optionally, such a computer system may include a display device 105 coupled to the bus 100 for displaying information to a computer user, a read only memory 103 coupled with the bus 100 for storing static information and instructions for the processor 101, a data storage device 113 such as a magnetic disk and disk drive coupled with the bus 100 for storing information and instructions, and an alphanumeric input device 106 including alphanumeric and function keys coupled to the bus 100 for communicating information and command selections to the processor 101.

OPERATION OF THE PREFERRED EMBODIMENT

The processing logic of the preferred embodiment is operably disposed within random access memory 102 and, executed by processor 101 of the computer system described above. The processing logic of the present invention may equivalently be disposed in read-only memory 103 or other memory means accessible to processor 101 for execution. A means for loading and activating the processing logic of the present invention exists using techniques well known to those of ordinary skill in the art. Once activated, the processing logic of the present invention operates in the manner described below.

The flowcharts provided in FIGS. 2, 3a, 3b, and 4–12 are used to best describe the processing logic of the present invention. In order to implement the processing logic of the present invention, several data structures are defined and used throughout the processing performed by the preferred embodiment. These data structures include a list of processes, a list of signals, and a list of process-to-signal relationships including a list of sensitive signals. The list of processes includes the name and a definition of processes that make up a particular logic network. A process is a functional logic block, circuit or group of signals that produce a particular result. The list of signals contains a name and definition of signals that are input to and output from processes. Information pertaining to each signal is maintained by the present invention. Such signal information includes the current state of the signal, the last state held by the signal prior to transitioning to the current state and the next state of the signal to which the signal will transition from the current state. Other information maintained for each signal is a changed state notifier which identifies whether the state of the signal has changed from the last cycle. The third set of information maintained by the present invention is a list of process to signal relationships. This data includes a list of sensitive signals associated with a particular process.

Listing A, provided herein, presents the Baucus Naur description of the supporting data structures and relationships used in the present invention. Refer to Listing B provided herein for the source code of the processing logic of the preferred embodiment of the present invention as coded in the C programming language. It will be apparent to those skilled in the art that alternative programming languages may be used. Both Listing A and Listing B are provided at the end of this detailed description, but before the claims.

Figure 2:
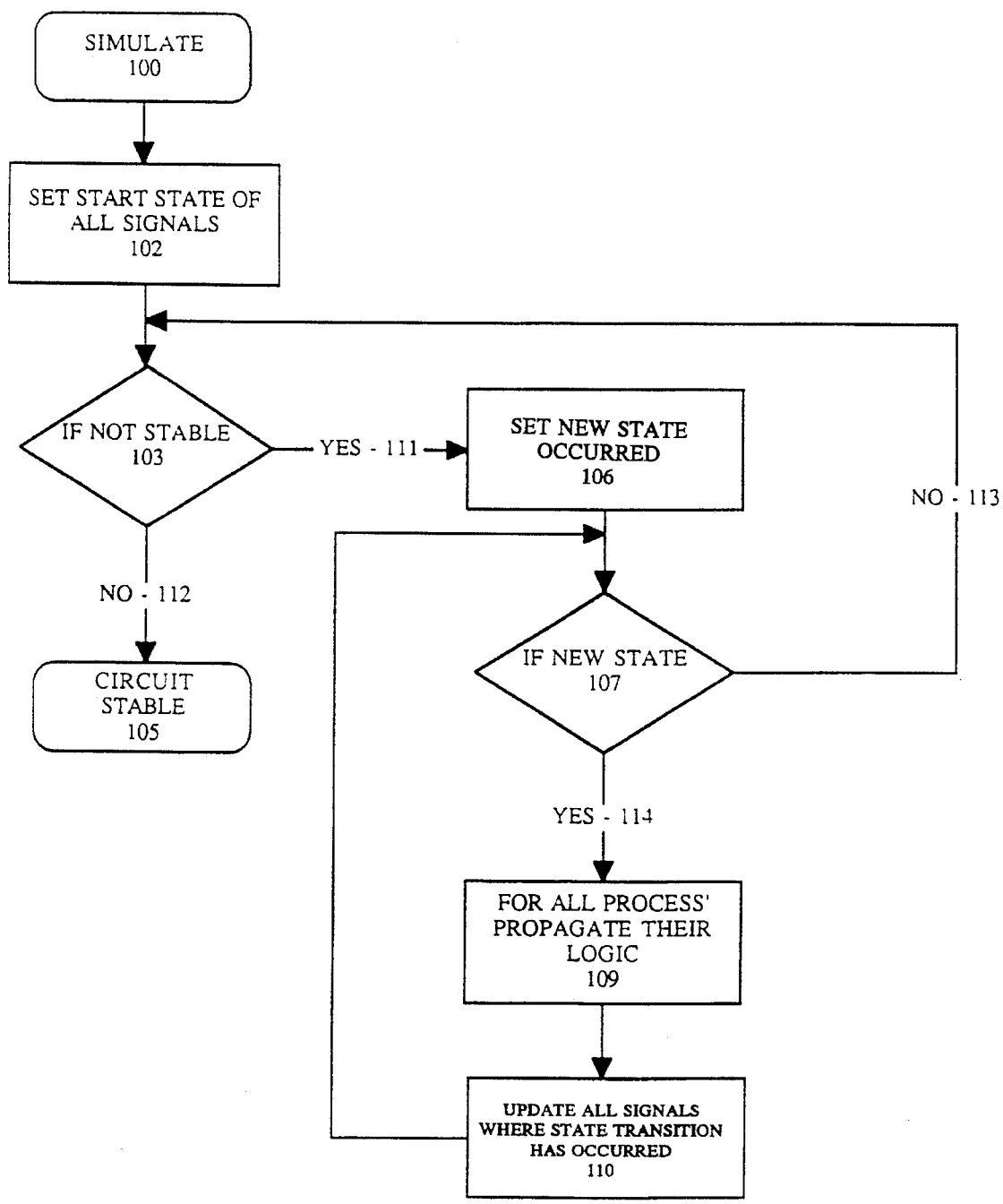
FIG. 2 is a flowchart showing the overall process flow of the logic simulator of the present invention.

Referring now to the first flowchart of the processing logic of the present invention illustrated in FIG. 2, an overall flowchart of the logic simulator of the present invention is illustrated. Upon activation of the present invention, processing control passes to processing block 100 illustrated in FIG. 2. First, the start state of all signals is initialized in processing block 102. It is assumed that the network is initially unstable. The logic contained within processing block 102 is more fully defined and illustrated in FIGS. 3a and 3b and described below. Once the start state of all signals is set, a test is performed to determine if the logic network being simulated is in a stable condition. A stable network exists when either no signals are changing or when signals are changing in a predictable manner. If this is the case, execution of the simulator may be terminated for this cycle at processing block 105. If the logic network is not stable, processing path 111 is taken to processing block 106 where a data item is set to indicate that a new logic state has occurred. It is assumed in processing the logic network under simulation that the network will eventually stabilize. Starting with decision block 107, a loop is initiated for propagating signals and updating signal states throughout the logic network. In processing block 109, the logic associated with each process defined in the system is propagated. A more detailed description of the processing logic within processing block 109 is illustrated in FIGS. 4–10 and described below. Once the logic is propagated (processing block 109), the new state for all signals for which a state transition has occurred is set in processing block 110. A more detailed description of the processing logic contained within processing block 110 is illustrated in the flowcharts presented in FIGS. 11 and 12 and described below. Once the new states of signals have been set (processing block 110), processing control returns to decision block 107 where a test is performed to determine if a new state has been encountered. The loop between decision block 107 and processing block 110 continues as long as signals transition to a new state. When a new state is not encountered, processing path 113 is taken back to decision block 103. If the logic network has still not stabilized (processing path 111), a new state condition is forced in processing block 106 and the loop between decision block 107 and processing block 110 is repeated. These loop iterations continue until the logic network stabilizes and simulation processing terminates at processing block 105 via processing path 112.

Figure 3A:
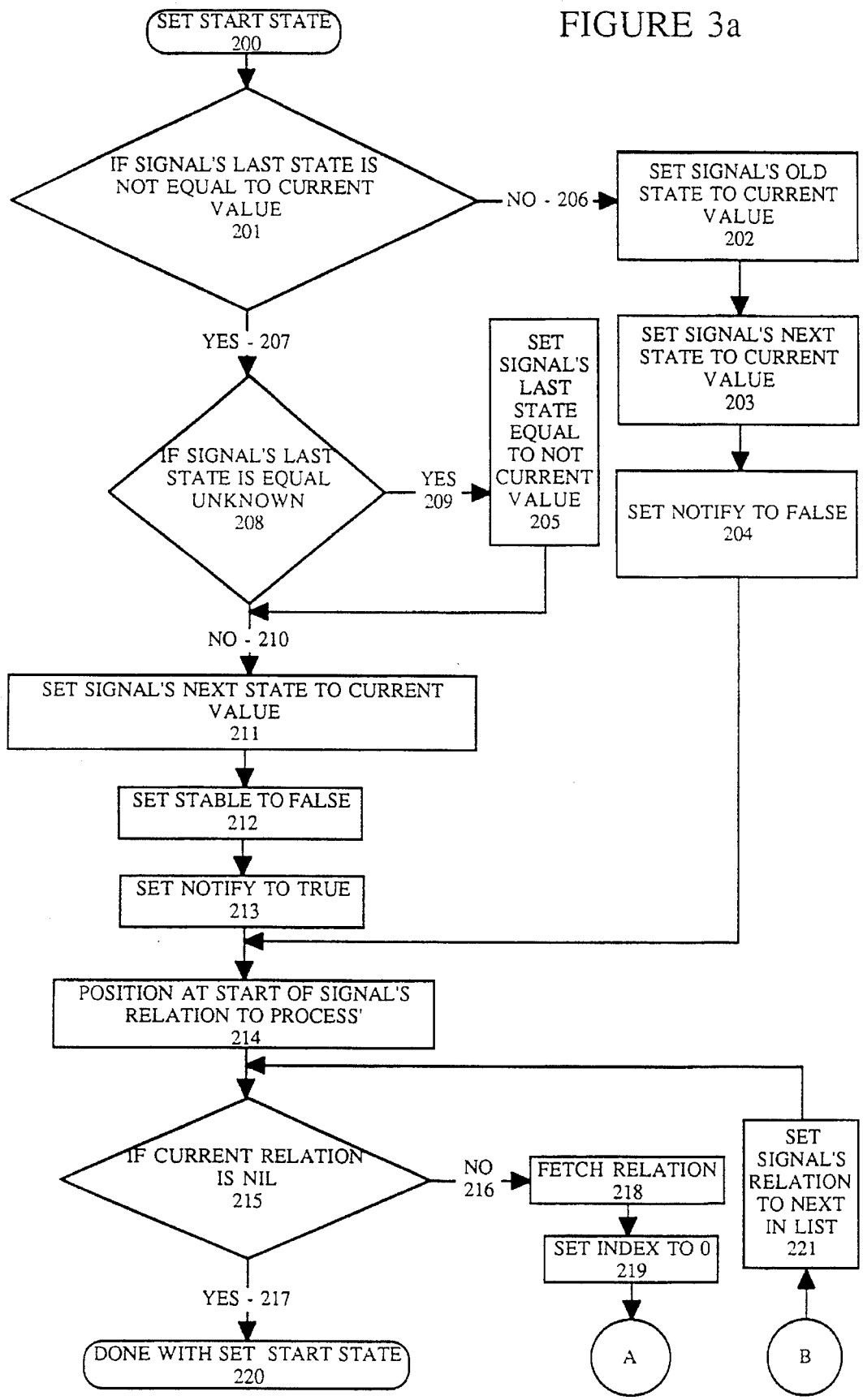
FIGS. 3a and 3b are together a flowchart that shows the process flow of the logic simulator of the present invention in setting the first state of a signal.

Referring now to FIG. 3a, a more detailed description of the processing logic contained within processing block 102 is depicted. For each signal defined in a particular logic network under simulation, the signal's last state is compared with its current value in decision block 201. If the signal's current state is equal to its last state, processing path 206 is taken to processing block 202 where the signal's old state is set to its current value. Similarly, the signal's next state is also set to its current value in processing block 203. A notify indication is then set to false in processing block 204 thereby indicating that no state change has occurred for a signal. Execution control is then transferred to processing block 214.

Referring again to decision block 201, if the current signal's last state is not equal to its current value (processing path 207) and the signal's last state is unknown (processing path 209), the signal's last state is set equal to a value not equal to its current value (processing block 205). In this way, the signal's last state is set to a known value but a value different from its current value. The signal's next state is set to its current value in processing block 211. A logic network stability indicator is set to a false value (processing block 212) and the notify indication for this signal is set to a true value (processing block 213) indicating that a signal has changed state. At this point, the state parameters associated with each signal have been initialized and the network stability indicator has been set to a value corresponding to state change information associated with each signal.

Starting at processing block 214, the list of process-to-signal relationships is traversed in order to properly set up the states of signals in relation to each other. A pointer to an initial position in the list of process-to-signal relationships is set in processing block 214. A loop is then initiated for each relationship in the list. If the relation currently being processed is nil or empty, processing for the set start state procedure terminates at processing block 220 via processing path 217. If, however, the relation currently being processed is not nil or empty, processing path 216 is taken to processing block 218 where the relation is retrieved from the list and an index for accessing sensitive signals associated with the process is initialized to zero in processing block 219. Execution control then transfers to the bubble labeled A illustrated in FIG. 3b.

Figure 3B:
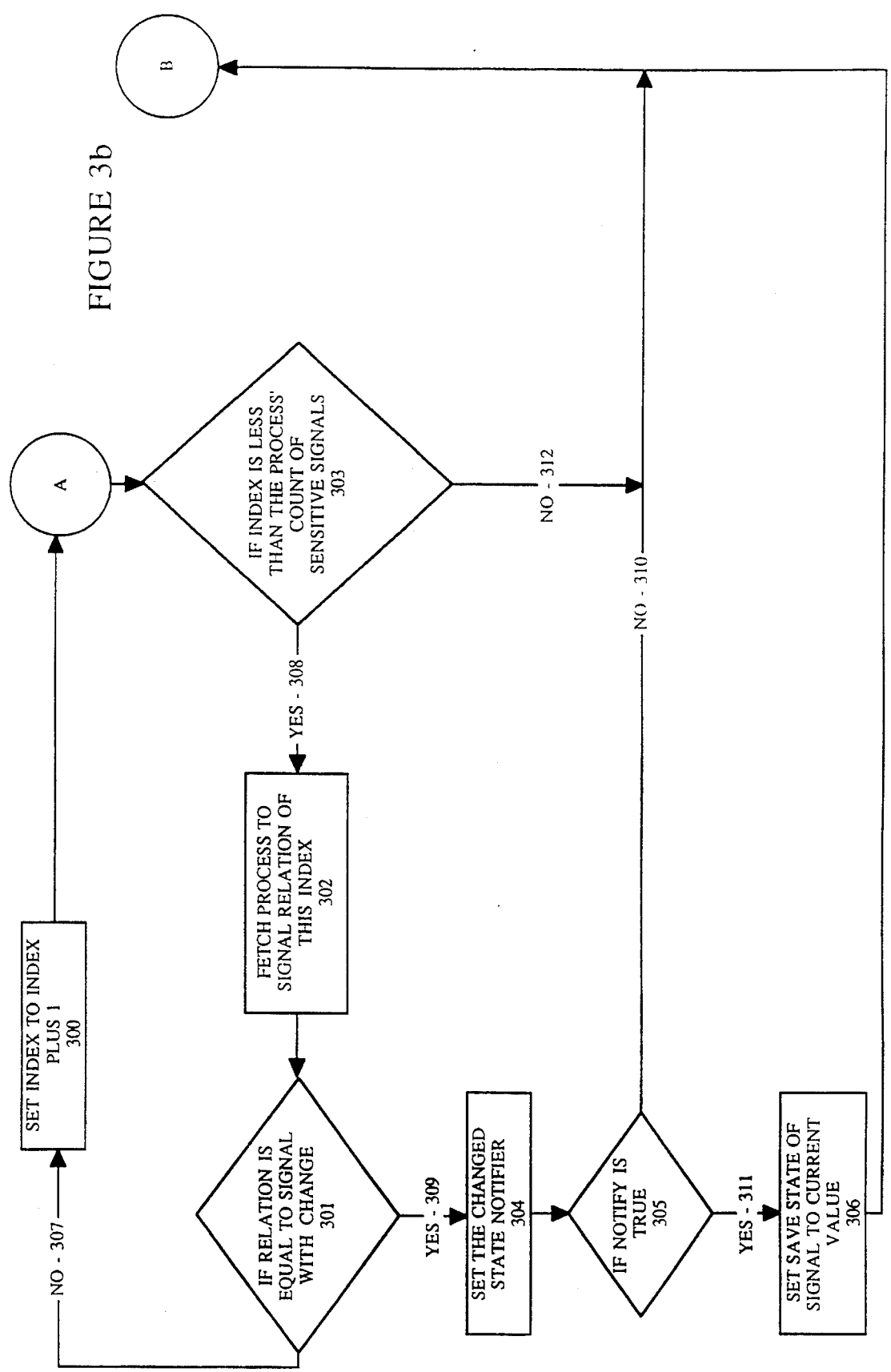

Referring now to FIG. 3b at the bubble labeled A, a test is performed to determine if each of the sensitive signals associated with a process have been updated (decision block 303). If a sensitive signal remains to be updated, processing path 308 is taken to processing block 302 where the indexed process-to-signal relationship is retrieved from the list of same. If the fetched signal relation is matched to the signal for which a state change was detected in decision block 201, processing path 309 is taken to processing block 304 where the changed state notifier associated with the related signal is set to true. If the notify flag is also true (processing path 311), the current value of the related signal is saved in a saved state data item (processing block 306). Processing then continues at the bubble labeled B as illustrated in FIG. 3a where a loop pointer is updated to the next item to the list of process-to-signal relationships (processing block 221). The loop then repeats starting at decision block 215 for the next relation in the list. The looping continues until processing path 217 is taken after the entire list of process-to-signal relationships has been processed.

Figure 4:
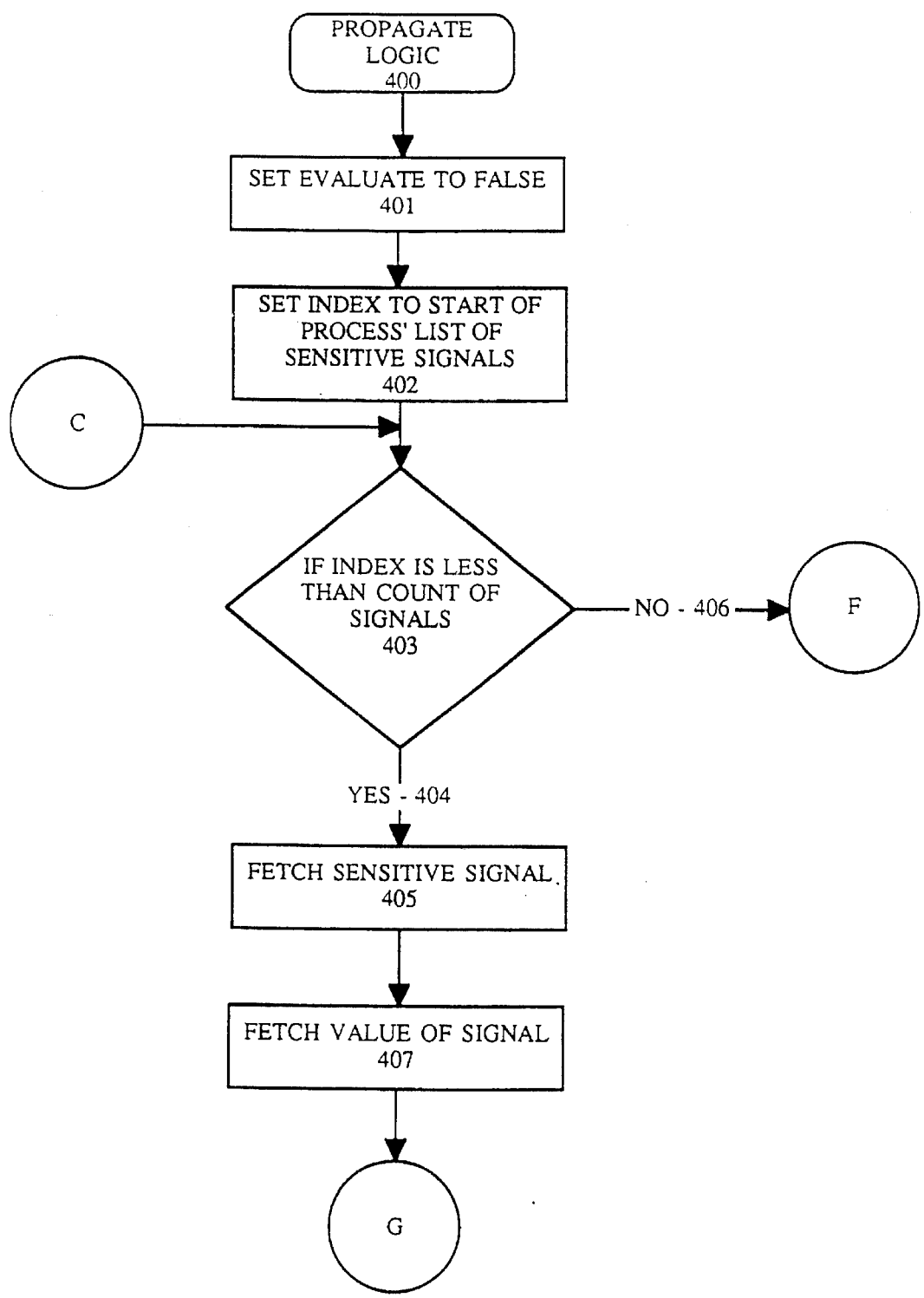
FIGS. 4, 5, 6, and 7 are together a flowchart that shows the process flow of the logic simulator of the present invention in propagating the logic within a process.

Referring now to FIGS. 4–10, the detailed propagation logic identified in processing block 109 is described. Referring now to FIG. 4, the propagate logic 400 of the present invention begins by initializing an evaluate indicator to false in processing block 401. The evaluate indicator is used to signal when propagation of signals through a logic network has not yet been completed. A pointer or index is then initialized to point to the start of the list of sensitive signals associated with a process (processing block 402). This list of sensitive signals is included in a list of process-to-signal relationships. As the processing logic of the present invention executes to completion, each process defined in the network and its associated sensitive signals are processed through the loop starting at decision block 403. For each of the sensitive signals associated with the process currently being evaluated, the sensitive signal is fetched (processing block 405) and the value associated with the signal is also retrieved (processing block 407). Processing then continues at the bubble labeled G illustrated in FIG. 5.

Figure 5:
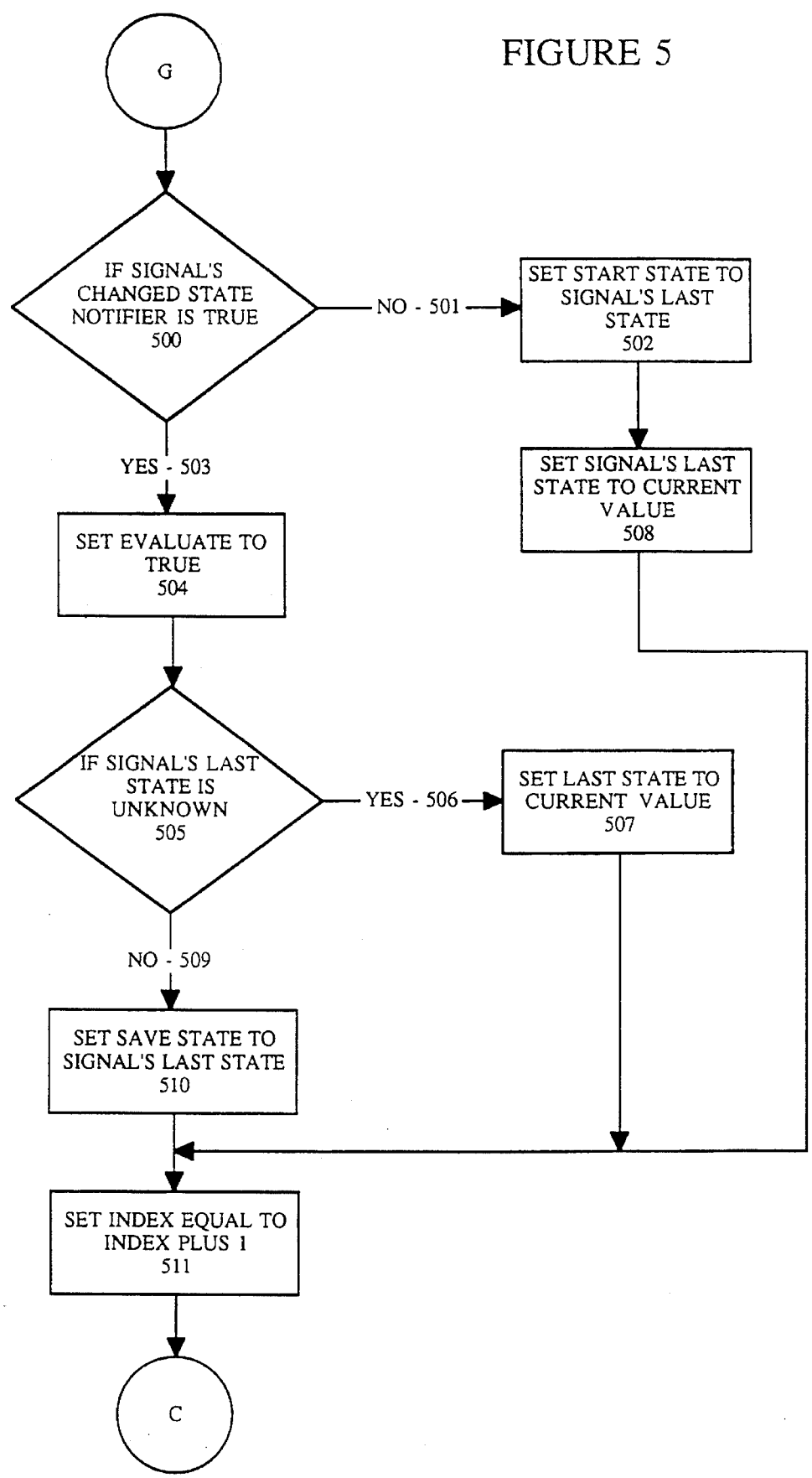

Referring now to FIG. 5, if the changed state notifier associated with the sensitive signal indicates that the sensitive signal has changed state (processing path 503), the evaluate indicator is set to true (processing block 504). If, however, the sensitive signal's state has not changed (processing path 501), the start state of the signal is set to its last state (processing block 502) and the sensitive signal's last state is set to its current value (processing block 508). Processing then continues at processing block 511 where a pointer or index is updated to point to the next sensitive signal in the list and processing loops back to the bubble labeled C illustrated in FIG. 4.

Referring still to FIG. 5, if the sensitive signal has changed state (processing path 503), the evaluate indicator is set to true (processing block 504). If the last state of the signal is unknown, the last state is set to the current value in processing block 507. If the last state of the signal is a known value (processing path 509), the last state is saved in a saved state data item in processing block 510. The pointer to the list of sensitive signals is updated to point to the next sensitive signal and execution control loops back to the bubble labeled C illustrated in FIG. 4 for a new iteration with the next sensitive signal. Once each sensitive signal of the current process is tested for a state change, processing control is transferred to the bubble labeled F as shown in FIG. 6.

Figure 6:
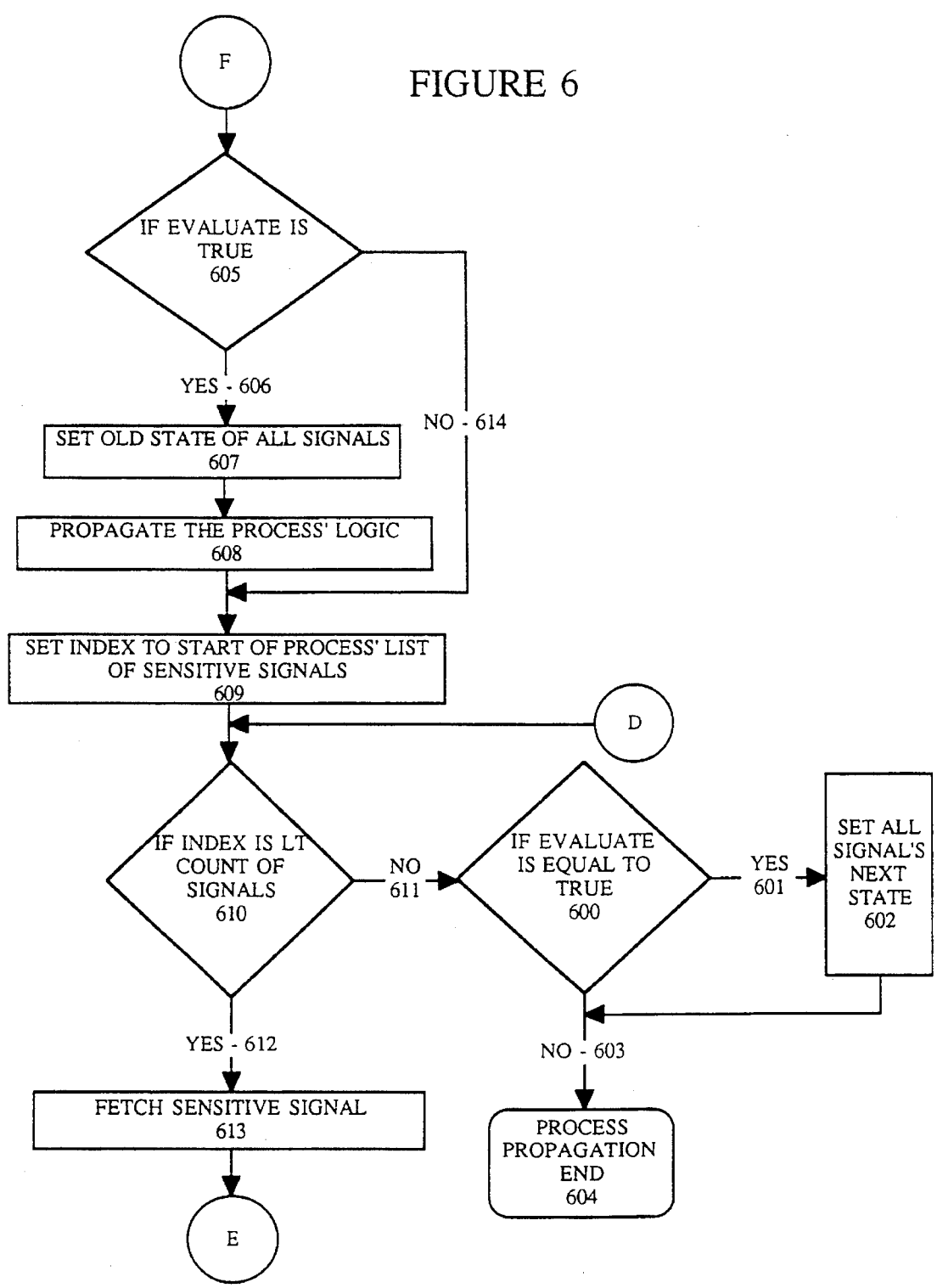

Referring now to FIG. 6, if the evaluate indicator is true (processing path 606), a sensitive signal state change has occurred and thus, the process logic must be propagated. In this case, the old state of all signals of the process are set to their current value (processing block 607) and the process logic is propagated (processing block 608). The process logic is propagated by sequential evaluation of the processes combinatorial logic using a technique disclosed in a copending patent application entitled "Programmable Interpretive Virtual Machine" filed concurrently with the present patent application. Once the process logic has been propagated, the list of sensitive signals associated with the process is again checked for the occurrence of a state change for a sensitive signal. This processing loop begins by the initialization of a pointer or index into the list of sensitive signals associated with the process (processing block 609). A loop is then initiated at decision block 610 and iterated for each sensitive signal in the list of signals associated with the process. The currently indexed sensitive signal is fetched in processing block 613 and processing continues at the bubble labeled E as illustrated in FIG. 7.

Figure 7:
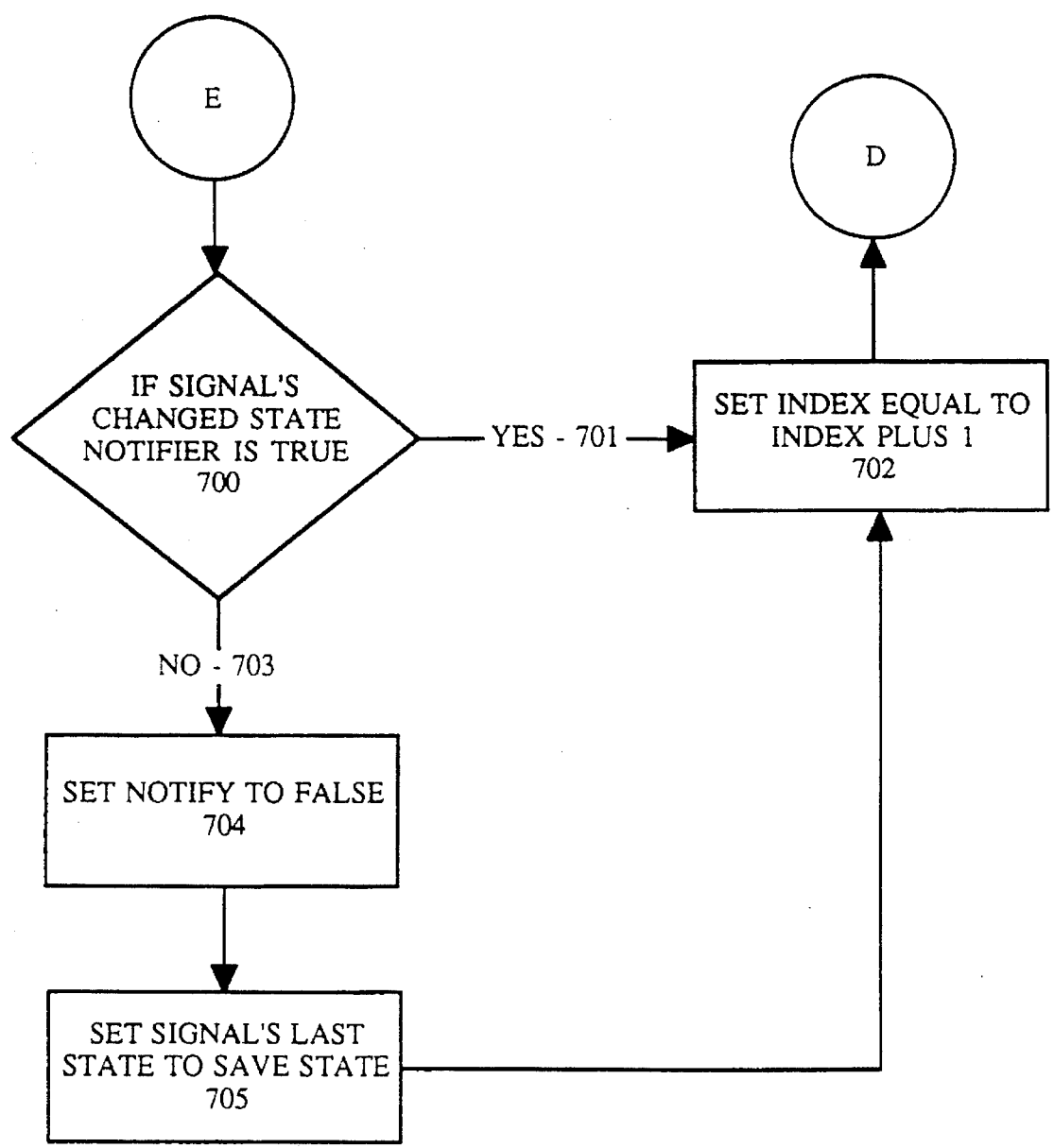

Referring now to FIG. 7, if the indexed signal's state has changed (processing path 701), no further action in this loop is necessary. Thus, the index into the list of sensitive signals is updated to point to the next sensitive signal and processing continues at the bubble labeled D illustrated in FIG. 6 where processing for the next sensitive signal continues. If, however, the currently indexed sensitive signal has changed state (processing path 703), the notify indicator is set to false (processing block 704) and the signal's last state is set to a saved value (processing block 705). Execution then loops back to the bubble labeled D in FIG. 6 after the index or pointer to sensitive signals is updated to point to the next sensitive signal (processing block 702). This looping for sensitive signals continues until the list of sensitive signals associated with the current process is exhausted (processing path 611) as illustrated in FIG. 6. Referring again to FIG. 6, if the evaluate indicator is true (processing path 601), the signals associated with the process are set to their next state (processing block 602). A detailed description of the processing logic contained within processing block 602 is illustrated in flowchart form in FIGS. 9 and 10. Once the next state of all signals is set, process propagation terminates at termination box 604.

Figure 8:
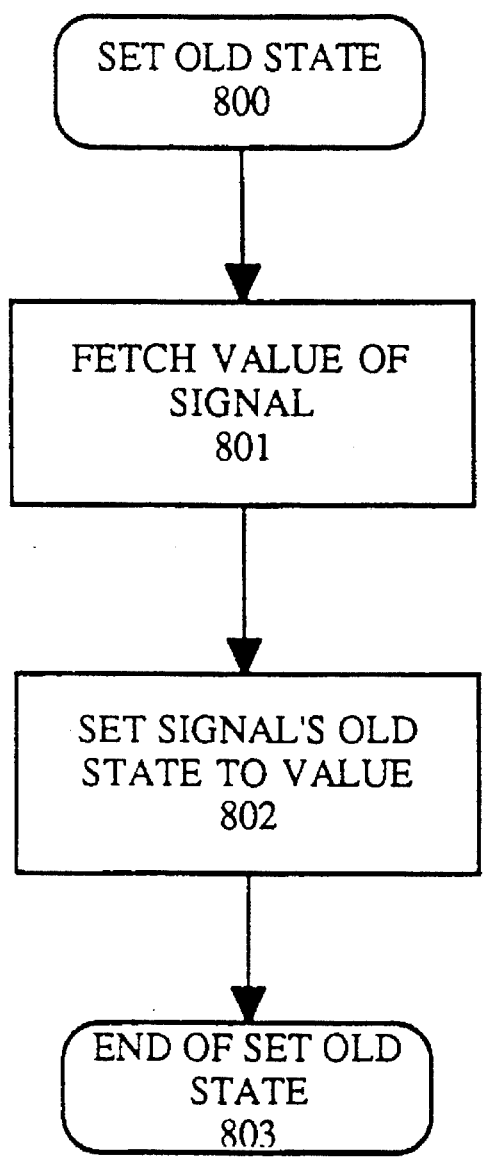
FIG. 8 is a flowchart that shows the process flow of the logic simulator of the present invention in setting the old state of a signal.

Referring now to FIG. 8, the logic for setting the old state of all signals is presented in detail. First, the current value of the signal is fetched in processing block 801. This current value is then stored into the old state associated with the signal in processing block 802. Set old state execution then terminates at termination box 803.

Figure 9:
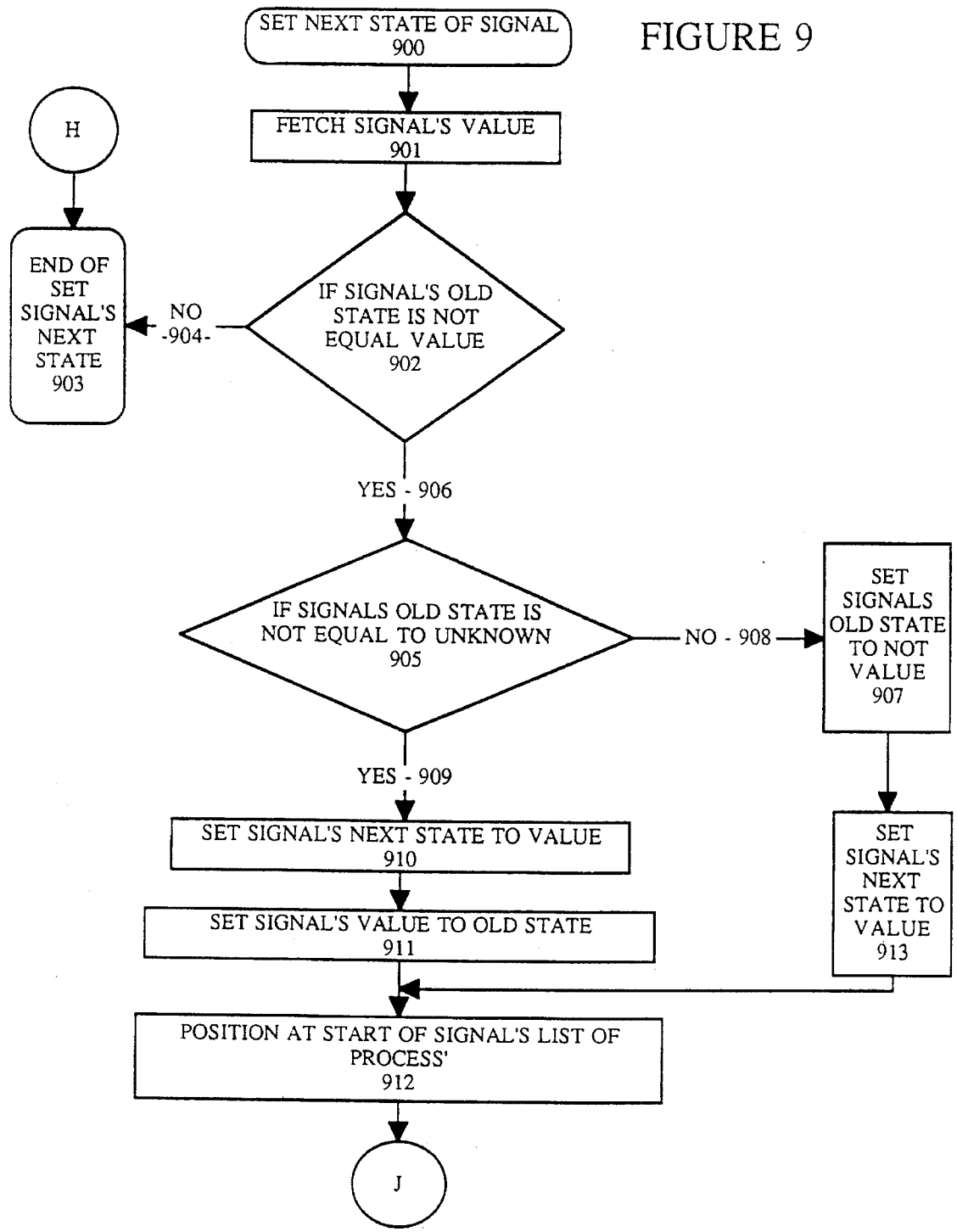
FIGS. 9 and 10 are together of a flowchart that shows the process flow of the logic simulator of the present invention in setting the next state of a signal.

Referring now to FIG. 9, the processing associated with setting the next state of a signal is presented in detail. First, the signal's current state value is fetched in processing block 901. If the signal has not changed state (processing path 904), processing terminates at termination box 903. If, however, the signal's old value is not equal to its current value (processing path 906) and the signal's old state is a known value (processing path 909), the signal's next state is set to the value of its current state in processing block 910 and the value of the signal's current state is set to its old state value (processing block 911) . If the old state of the signal is unknown (processing path 908), the old state of the signal is set to a known value, but a value different than the signal's current value (processing block 907). The signal's next state is set to the value of its current state in processing block 913. A pointer or index is initialized to point to the first sensitive signal in the list of sensitive signals associated with the current process (processing block 912). Processing then continues at the bubble labeled J illustrated in FIG. 10.

Figure 10:
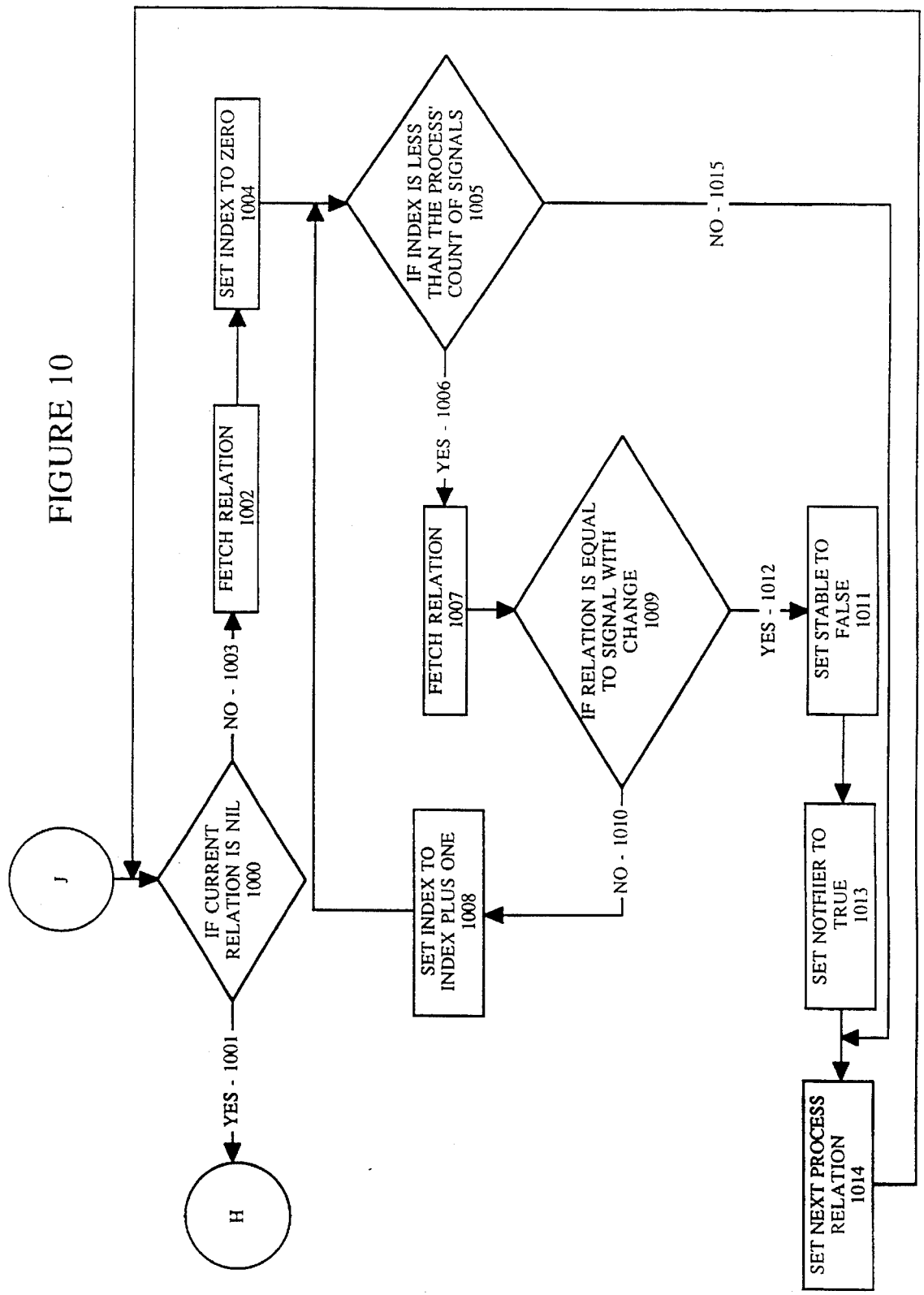

Referring now to FIG. 10 at the bubble labeled J, a loop is started for scanning the list of sensitive signals associated with the current process. This scanning of the list of sensitive signals is similar to the loop shown and described in relation to FIGS. 3a and 3b starting at decision block 215. Referring to FIG. 10 at decision block 1009, if the currently indexed sensitive signal is equal to the signal for which a state change has occurred (processing path 1012), a stable indicator is set to false indicating that the logic network has not yet stabilized (processing block 1011). A notifier indicator is set to true in processing block 1013. The pointer or index to sensitive signals in the list of sensitive signals associated with the current process is updated in processing block 1014 to point to the next sensitive signal in the list and processing continues at decision block 1000. The loop starting at decision block 1000 continues until each of the sensitive signals associated with a process have been updated. Upon completion of the list, processing path 1001 is taken to the bubble labeled H as illustrated in FIG. 9 where processing for the set next state procedure is terminated at termination block 903.

Figure 11:
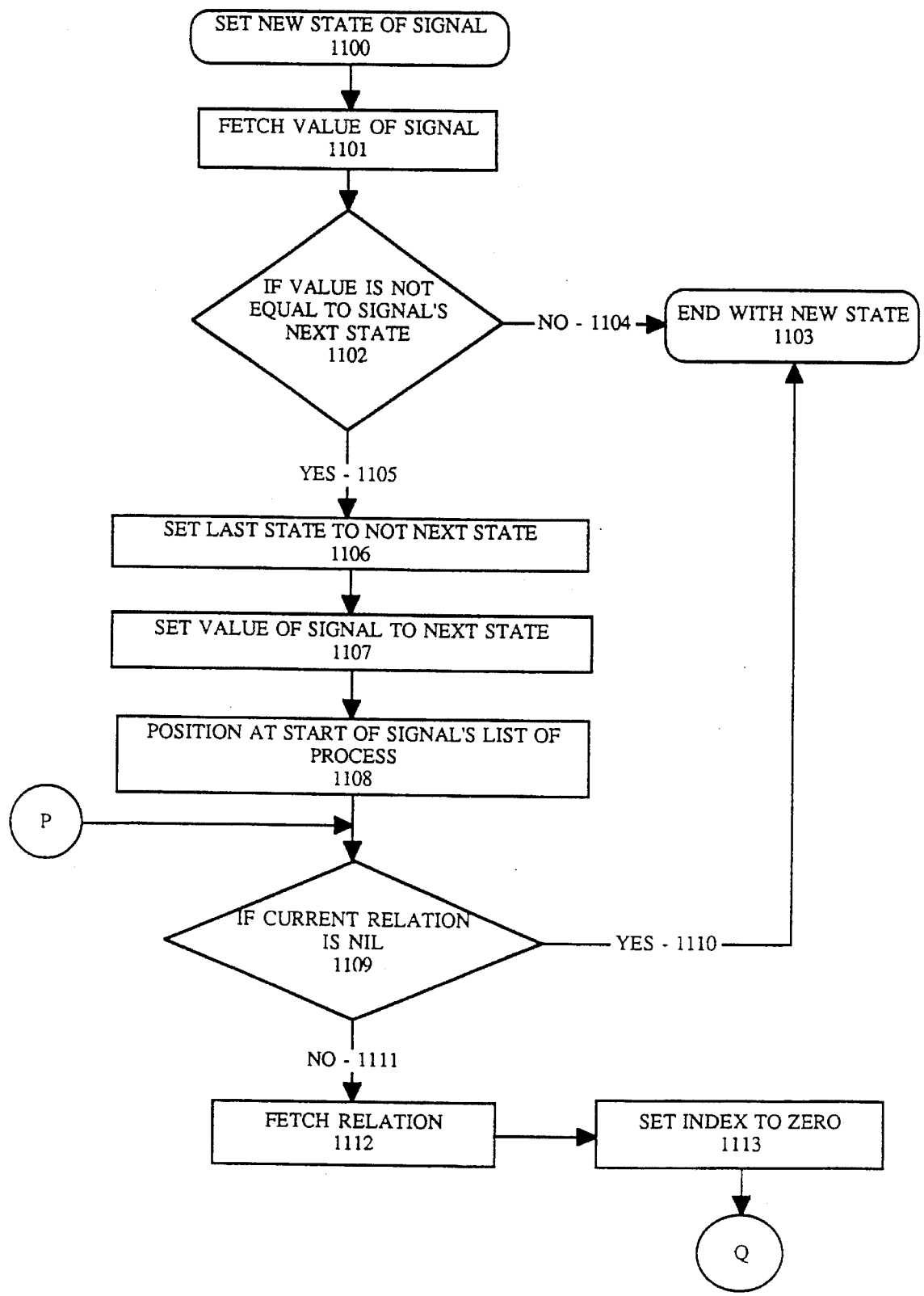
FIGS. 11 and 12 are together a flowchart that shows the process flow of the logic simulator of the present invention in setting the new state of a signal.

Referring now to FIG. 11, the processing associated with setting the new state of a signal is illustrated. First, the current value of the signal is fetched in processing block 1101. If current value of the signal is equal to its next state value (processing path 1104), new state processing is terminated at termination block 1103. If, however, the current value of the signal is not equal to its next state value (processing path 1105), the last state of the signal is set to a known value other than the value of the signal's next state in processing block 1106. The current value of the signal is then set to the value of its next state in processing block 1107. At processing block 1108, an index or pointer is initialized to the start of the list of sensitive signals associated with the current process. Starting at decision block 1109, a loop is started for processing each of the sensitive signals associated with the current process. This loop is similar to that described and illustrated in FIGS. 3a and 3b starting at decision block 215.

Figure 12:
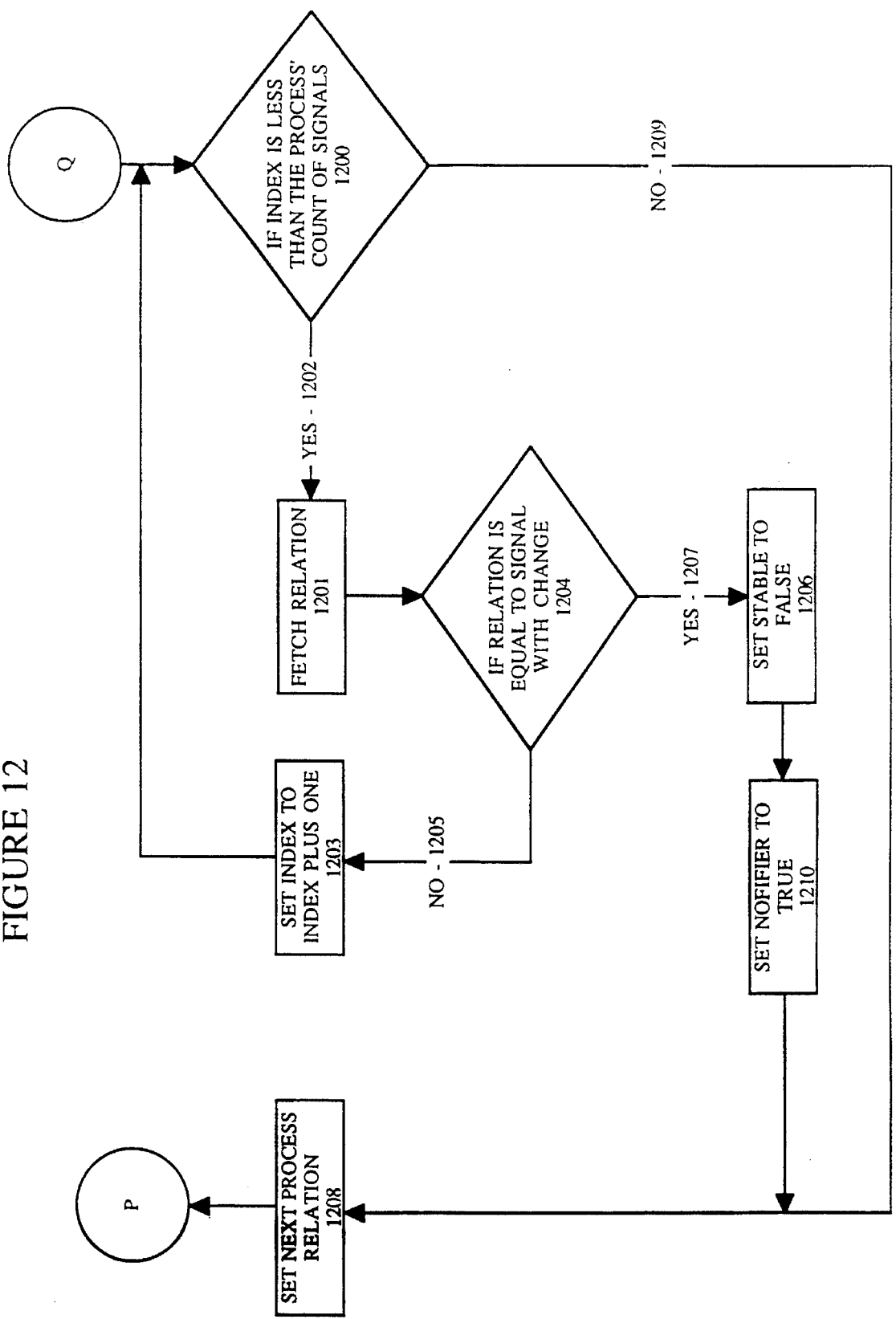

Referring now to FIG. 12, the loop through the list of sensitive signals continues as illustrated. At decision block 1204, if a sensitive signal is equal to the signal for which a changed has been noted (processing path 1207), a stable indicator is set to false in processing block 1206 and a notify indication is set to true in processing block 1210. Processing then continues at the top of the loop (decision block 1109), illustrated in FIG. 11, for the next iteration with a new sensitive signal until each of the sensitive signals in the list have been processed. Upon completion of the list, processing path 1110 is taken to termination box 1103 where processing for the new state of the signal is terminated.

Thus, a logic simulation system providing optimal configurability of combinatorial and sequential logic circuits in a simulated behavioral form is disclosed.

Although this invention has been shown in relation to a particular embodiment, it should not be considered so limited. Rather, it is limited only by the appended claims.

LISTING A

Baucus Naur Form Conventions:

| | | |
|---|---|---|
| 5 | ::= | definition |
| | ' ' | literals |
| | < > | nonterminals |
| | [ ... ] | optional |
| | ( ... ) | grouping |
| 10 | { ... } | repeat 0 or more times |
| | ... \| ... | choice (or) |
| | :m:n | repeat m to n times |

| | | | |
|---|---|---|---|
| | process_list | ::= | \ |
| 15 | | | |
| | factor_list | ::= | \ |
| | page | ::= | \<count\> \<page_zero\> {leaf}:0x0001:0x1001 |
| 20 | count | ::= | 2\|13\|14\|15\|16\|17\|18 |
| | page_zero | ::= | \ |
| | leaf | ::= | \<key\> \<address\> \ |
| 25 | | | |
| | key | ::= | \<name\> 0x00000000 |
| | name | ::= | ( 'a' \| 'b' ... 'z' \| 'A' \| 'B' ... 'Z' \| |
| | | | '.' \| '_' \| '0' \| '1' \| '2' ... '9' \| |
| 30 | | | \<name\> ) \| 0x00000000 |
| | address | ::= | \<symbol\> |
| | symbol | ::= | \<key\> |
| 35 | | | \<value\> |
| | | | \<enabled\> |
| | value | ::= | 0x00000000 ... 0xFFFFFFFF |
| 40 | enabled | ::= | 0x0000 \| 0x0001 |
| | process_object | ::= | \<process\> |
| | process | ::= | \<key\> |
| 45 | | | \<symbol\> |
| | | | \<count\> |
| | | | {changed_state}:1:512 |
| | | | {save_state}:1:512 |
| | | | {factors}:1:512 |
| 50 | | | |
| | changed_state | ::= | 0x00 \| 0x01 |
| | save_state | ::= | 0x00000000 ... 0xFFFFFFFF |

```
     last_state         ::=    0x00000000 ... 0xFFFFFFFF
     old_state          ::=    0x00000000 ... 0xFFFFFFFF
     next_state         ::=    0x00000000 ... 0xFFFFFFFF
5    process_list       ::=    <related> | 0x00000000
     related            ::=    ( <process_object> <related> ) | 0x00000000
```

LISTING B

```
       /*
        * Btree Page
        /*
 5     struct s_page {                                  /* ''                          */
           unsigned short m;                            /* count of items in page            */
           struct s_page *p0;                           /* page zero                         */
           /*
            * Btree LEAF
10          /*
           struct s_item {                              /* '<leaf>'                          */
              char *key;                                /* key of item '<key>'               */
              char *addr;                               /* data of item '<symbol>'           */
              struct s_page *p;                         /* next page on tree ''        */
15         } e[9];                                      /* items in this page                */
       };

typedef struct s_page PAGE;                      /* page typedef                      */
       typedef struct s_item LEAF;                      /* item typedef                      */
20
       #define NIL( x )         ( x * ) 0
       #define PUT              1
       #define GET              0
       #define FOUND            1
25     #define NOT_FOUND        0 int search( x, a, h, v, addr, act )
           char *x;                                     /* key to search '<key>'             */
           PAGE *a;                                     /* page to search on ''        */
30         int *h;                                      /* notify if tree is higher          */
           LEAF *v;                                     /* item that has emerged '<leaf>'    */
           char **addr;                                 /* data to store with key '<symbol>' */
           short act;                                   /* search action PUT | GET           */
       {
35         int status;                                  /* running status                    */
           unsigned short k, l, r;                      /* indexing variables                */
           PAGE *q;                                     /* emerging page                     */
           LEAF u;                                      /* emerging item                     */

40         /*
            * search for key x on page *a; h = false
            */
           status = NOT_FOUND;
           if ( a == NIL(PAGE) ) {
45            if ( act == PUT ) {
                  *h = 1;
                  v->key = x;
                  v->addr = (char *) *addr;
                  v->p = NIL(PAGE);
50            }
              else {
                  status = NOT_FOUND;
              }
           }
55         else {

/*
               * binary array search
               */
60            l = 1;
```

```
                    r = a->m;
                    do {
                            k = (l+r)/2;
                            if ( strcmp( x, a->e[k].key ) <= 0 )
 5                                  r = k-1;
                            if ( strcmp( x, a->e[k].key ) >= 0 )
                                    l = k+1;
                    } while(r >= l);

10                  if ( l-r > 1 ) { /* found it */
                            if ( act != PUT ) {
                                    *addr = a->e[k].addr;
                            }
                            *h = 0;
15                          status = FOUND;
                    }
                    else { /* item is not in this page */
                            if ( r == 0 )
                                    q = a->p0;
20                          else
                                    q = a->e[r].p;
                            status = search( x, q, h, &u, addr, act );
                            if ( status == NOT_FOUND )
                                    if ( act == PUT )
25                                          if ( *h )
                                                    insert( a, r, h, v, &u );
                    }
            }
            return ( status );
30  }
    /*
     * insert( )
     *      Insert An LEAF into the Passed Btree " a "
     *
35   *      Purpose:
     *              Insert u to the right of a->e[r]
     *
     */
    int insert(a, r, h, v, u)
40  PAGE *a;                        /* page to insert on ''   */
    unsigned short r;               /* index of insertion           */
    int *h;                         /* tree has grown               */
    LEAF *v, *u;                    /* emerging items               */
    {
45  int status = 0;                 /* running status               */
    unsigned short i;               /* indexing variable            */
    PAGE *b;                        /* emerged page                 */
    char *malloc( );

50                  if ( a->m < NN ) {
                    a->m += 1;
                    *h = 0;
                    for ( i=a->m; i >= r+2; i-- ) {
                            a->e[i].key = a->e[i-1].key;
55                          a->e[i].p   = a->e[i-1].p;
                            a->e[i].addr = a->e[i-1].addr;
                    }
                    a->e[r+1].key = u->key;
                    a->e[r+1].p   = u->p;
60                  a->e[r+1].addr = u->addr;
```

```
            }
        /*
         * page *a is full; split it and
         * assign the emerging item to v
5       */
        else {
                b = (PAGE *) malloc( (unsigned) sizeof(PAGE) );
                if ( b == NIL(PAGE) ){
                status = -1;
10              return( status );
                }
                if( r <= N ) {
                        if ( r == N ) {
                                v->key = u->key;
15                              v->p = u->p;
                                v->addr = u->addr;

else {
                                v->key = a->e[N].key;
20                              v->p = a->e[N].p;
                                v->addr = a->e[N].addr;
                                for ( i=N; i >= r+2; i-- ) {
                                        a->e[i].key = a->e[i-1].key;
                                        a->e[i].p = a->e[i-1].p;
25                                      a->e[i].addr = a->e[i-1].addr;
                                }
                                a->e[r+1].key = u->key;
                                a->e[r+1].p = u->p;
                                a->e[r+1].addr = u->addr;
30                      }
                        for ( i=1; i <= N; i++ ) {
                                b->e[i].key = a->e[i+N].key;
                                b->e[i].p = a->e[i+N].p;
                                b->e[i].addr = a->e[i+N].addr;
35                      }
                }
                /*
                 * insert u in right page
                /*
40              else {
                        r = r-N;
                        v->key = a->e[N+1].key;
                        v->p = a->e[N+1].p;
                        v->addr = a->e[N+1].addr;
45                      for ( i=1; i <= r-1; i++ ) {
                                b->e[i].key = a->e[N+i+1].key;
                                b->e[i].p = a->e[N+i+1].p;
                                b->e[i].addr = a->e[N+i+1].addr;
                        }
50                      b->e[r].key = u->key;
                        b->e[r].p = u->p;
                        b->e[r].addr = u->addr;
                        for ( i=r+1; i <= N; i++ ) {
                                b->e[i].key = a->e[i+N].key;
55                              b->e[i].p = a->e[i+N].p;
                                b->e[i].addr = a->e[i+N].addr;
                        }
                }
                a->m = N;
60              b->m = N;
```

```
                b->p0 = v->p;
                v->p = b;
        }
        return ( status );
}

/*
 *delete( )
        *Delete an LEAF from Btree " a "
 *
 *      Purpose:
 *              search and delete key x in b_tree a; if a page
 *              underflow is necessary, balance with adjacent
 *              page if possible, otherwise merge; h = "page a
 *              is undersize"
 */
int delete( x, a, h )
char *x;                        /* key to search for                    */
PAGE *a;                        /* page to search on                    */
int *h;                         /* notify if tree is undersize          */
{
int status = 0;                 /* running status                       */
unsigned short i, k, l, r;      /* indexing variables                   */
PAGE *q;                        /* emerging page                        */ if ( a == NIL(PAGE) ) {
                *h = 0;
                status = 1;
        }
        else {

/*
                *binary array search
                */
                l = 1;
                r = a->m;
                do {
                        k = (l+r)/2;
                        if ( strcmp( x, a->e[k].key ) <= 0 )
                                r = k-1;
                        if ( strcmp( x, a->e[k].key ) >= 0 )
                                l = k+1;
                } while( r >= l );

if ( r == 0 )
                        q = a->p0;
                else ]
                        q = a->e[r].p;

/*
                * found, now delete e[k]
                */
                if ( l-r > 1 ) {
                        if ( q == NIL(PAGE) ) {     /* a is leaf page*/
                                a->m -= 1;
                                *h = a->m < N;
                                for ( i = k; i <= a->m; i++ ) {
                                        a->e[i].key  = a->e[i+1].key;
                                        a->e[i].p    = a->e[i+1].p;
                                        a->e[i].addr = a->e[i+1].addr;
```

```
                        }
                }
                else {
                        del( q, h, a, k );
                        if ( *h )
                                underflow( a, q, r, h );
                }
        }
        else {
                status = delete( x, q, h );
                if ( *h )
                        underflow( a, q, r, h );
        }
    }
    return ( status );
}

/*
*del( )
*
*       Delete An item from Btree " a "
*/
int del( p, h, a, k )
PAGE *p;                                /* page to delete item on        */
int *h; /* notify if tree is smaller     */
PAGE *a;                                /* emerging page                 */
unsigned short k;                       /* index of item to delete       */
}
PAGE *q;

q = p->e[p->m].p;
        if ( q != NIL(PAGE) ) {
                del( q, h, a, k );
                if ( *h )
                        underflow( p, q, p->m, h );
        }
        else {
                a->e[k].key  = p->e[p->m].key;
                a->e[k].addr = p->e[p->m].addr;
                p->m -= 1;
                *h = p->m < N;
        }
        return( 0 );
}

/*
*underflow( )
*
*       Handle Underflow Condition of Btree
*/
int underflow( c, a, s, h )
PAGE *c;                                /* ancestor page                 */
PAGE *a;                                /* underflow page                */
unsigned short s;                       /* elements in page              */
int *h;                                 /* tree is smaller               */
{
PAGE *b;                                /* emerging page */
unsigned short i, k, mb, mc;            /* indexing variables */ mc = c->m;                      /* h = true, a->m = N-1 */
```

```
            if ( s < mc ) {                /* b = page to the right of a */
                s += 1;
                b = c->e[s].p;
                mb = b->m;
                k = (mb-N+1)/2;            /* k = no. of items available */
                                           /* on adjacent page b */
                a->e[N].key = c->e[s].key;
                a->e[N].addr = c->e[s].addr;
                a->e[N].p = b->p0;
                if ( k > 0 ) {             /* move k items from b to a */
                    for(i=1; i<= k-1; i++) {
                        a->e[i+N].key = b->e[i].key;
                        a->e[i+N].addr = b->e[i].addr;
                        a->e[i+N].p = b->e[i].p;
                    }
                    c->e[s].key = b->e[k].key;
                    c->e[s].addr = b->e[k].addr;
                    c->e[s].p = b;
                    b->p0 = b->e[k].p;
                    mb -= k;
                    for ( i=1; i<=mb; i++ ) {
                        b->e[i].key = b->e[i+k].key;
                        b->e[i].addr = b->e[i+k].addr;
                        b->e[i].p = b->e[i+k].p;
                    }
                    b->m = mb;
                    a->m = N-1+k;
                    *h = 0;
                }
                else {                     /* merge pages a and b */
                    for ( i=1; i<=N; i++ ) {
                        a->e[i+N].key = b->e[i].key;
                        a->e[i+N].addr = b->e[i].addr;
                        a->e[i+N].p = b->e[i].p;
                    }
                    for ( i=s; i<= mc-1; i++ ) {
                        c->e[i].key = c->e[i+1].key;
                        c->e[i].addr = c->e[i+1].addr;
                        c->e[i].p = c->e[i+1].p;
                    }
                    a->m = NN;
                    c->m = mc-1;  /* dispose b */
                    *h = c->m < N;
                    free( (char *) b );
                }
            }
            else {                         /* b = page to the left of a */
                if(s == 1)
                    b = c->p0;
                else
                    b = c->e[s-1].p;
                mb = b->m + 1;
                k = (mb-N)/2;
                if ( k > 0 ) {             /* move k items from page b to a */
                    for ( i=N-1; i>=1; i-- ) {
                        a->e[i+k].key = a->e[i].key;
                        a->e[i+k].addr = a->e[i].addr;
                        a->e[i+k].p = a->e[i].p;
                    }
```

```
                a->e[k].key  = c->e[s].key;
                a->e[k].addr = c->e[s].addr;
                a->e[k].p = a->p0;
                mb = mb - k;
                for ( i=k-1; i>=1; i-- ) {
                    a->e[i].key  = b->e[i+mb].key;
                    a->e[i].addr = b->e[i+mb].addr;
                    a->e[i].p    = b->e[i+mb].p;
                }
                a->p0 = b->e[mb].p;
                c->e[s].key  = b->e[mb].key;
                c->e[s].addr = b->e[mb].addr;
                c->e[s].p = a;
                b->m = mb-1;
                a->m = N-1+k;
                *h = 0;
            }
            else }           /* merge pages a and b */
                b->e[mb].key  = c->e[s].key;
                b->e[mb].addr = c->e[s].addr;
                b->e[mb].p    = a->p0;
                for ( i=1; i<=N-1; i++ ) {
                    b->e[i+mb].key  = a->e[i].key;
                    b->e[i+mb].addr = a->e[i].addr;
                    b->e[i+mb].p    = a->e[i].p;
                }
                b->m = NN-
                c->m = mc-1;                    /* dispose a */
                *h = c->m < N;
                free( (char *) a );
            }
        }
        return( 0 );
}

/*
 * allelements( )
 *
 *      for each element in tree dispatch to the application the
 *      key and data field.
 *
 */
int allelements( p, func )
PAGE *p;
int (*func)( );
{
int i;
int ier = 0;

if ( p != NIL(PAGE) ) {
            for ( i=1; i<=p->m; i++ ) {
                if ( ( ier = (*func)( p->e[i].key, p->e[i].addr )) != 0 )
                    return( ier );
            }
            ier = allelements( p->p0, func );
            for ( i=1; ier == 0 && i<=p->m; i++ )
                ier = allelements( p->e[i].p, func );
        }
        return( ier );
```

}

```
int stable = 0;                         /*1 when all processes are stable */
int new_state = 1;                      /*0 when sensitivity list is */
                                        /*not stable */
PAGE *processes = NIL(PAGE);            /*the processes */
PAGE *signals = NIL(PAGE);              /*the sensitivity list */
/*
*Process Object
*/ struct s_pobj {
        char *name;                     /*name of process ... key to btree */
        Symbol *process;                /*the processes code */
        int count;                      /*num of sensitive nodes */
        int *changed_state;             /*list of which sense nodes changed */
        long *save_state;               /*val of sense node before propagate */
        struct s_sobj **sense_list;     /*the sensitive nodes */
};
typedef struct s_pobj POBJ;             /*typedef of process */
/*
*Related Process
*/
struct s_relproc {
        struct s_pobj *po;              /* a sensitive node's related process */
        struct s_relproc *next;         /* next in the list */
};
typedef struct s_relproc RELPROC;       /* typedef of relationship */
/*
*Signal Object
*/
struct s_sobj {
        Symbol *s;                      /* variable of node */
        long ls;                        /* last state of signal ... shows edge */
        long os;                        /* old state of signal */
        long ns;                        /* next state of signal */
        struct s_relproc *related_proc; /* list of process's sensitive */
};
typedef struct s_sobj SOBJ; /* typedef of sensitivity list node */

/*
*process_define( )
*
/*
int process_define( p, count, sp )
Symbol *p;
int count;
Symbol **sp;
{
PAGE *q;                                /* page of btree */
LEAF u;                                 /* item of btree */
int h;                                  /* status variables */
int ier = 0;
POBJ *proc;                             /* a process object */
char *malloc( );

q = NIL(PAGE);
        /*
        * does the process exist
```

```
          if ( search( p->name, processes, &h, &u, ( char ** ) &proc, GET ) ==
          FOUND ) {
                  /*
                  * yes error cannot redefine
                  */
                  return( -1 );
          }
          else {
                  /*
                  * not found; allocate some heap an initialize
                  */
                  proc = (POBJ *) malloc( (unsigned) sizeof( POBJ ) );
                  if ( proc == NIL(POBJ) ) {
                          return( SIMNOCORE );
                  }
                  proc->name = p->name;
                  proc->process = p;
                  proc->count = count; proc->sense_list = NIL(SOBJ *);

/*
                  * add to btree
                  */
                  (void) search(p->name, processes, &h, &u, (char**) &proc, PUT);
                  if ( h ) {
                          /*
                          * tree is higher
                          */
                          q = processes;
                          processes = (PAGE *) malloc ( (unsigned) sizeof ( PAGE ) );
                          if ( processes == NIL (PAGE) ) {
                                  return ( SIMNOCORE );
                          }
                          processes->m = 1;
                          processes->p0 = q;
                          processes->e[1].key = u.key;
                          processes->e[1].addr = u.addr;
                          processes->e[1].p = u.p;
                  }
                  /*
                  *define sensitive signals
                  */
                  ier = defsensitive( proc, count, sp );
          }
          return( ier );
}

/*
*defsensitive( )
*
*/
int defsensitive( proc, count, sp )
POBJ *proc;
int count;
Symbol **sp;
{
PAGE *q;
LEAF u;
int h;
int i;
int got_it = 0;
```

```
        RELPROC *rp;
        SOBJ *node;
        char *malloc( );

5              q = NIL(PAGE);
                if ( count > 0 ) {
                        proc->sense_list (SOBJ **)
                                        malloc ( count * sizeof ( SOBJ ** ) );
                        if ( proc->sense_list == NIL (SOBJ *) ) {
10                              return( -1 );
                        }
                        proc->changed_state = (int *) malloc( count * sizeof( int ) );
                        if ( proc->changed_state == NIL(int) ) {
                                return( -1 );
15                      }
                        proc->save_state = (long *) malloc( count * sizeof( long ) );
                        if ( proc->save_state == NIL(long) ) {
                                return( -1 );
                        }
20                      for ( i = 0; i < count; i++ ) {
                                proc->changed_state[i] = 0;
                                proc->save_state[i] = (long) -1;
                        }
                }
25      for ( i = 0 ; i < count; i++ ) {
                /*
                 * does the process exist
                 */
30              if ( search( sp[i]->name, signals,
                                &h, &u, (char **) &node, GET ) == NOT_FOUND ) {
                        /*
                         * not found; allocate some heap an initialize
                         */
35                      node = (SOBJ *) malloc ( (unsigned) sizeof ( SOBJ ) );
                        if ( node == NIL (SOBJ) ) {
                                return( -1 );
                        }
                        node->s = sp[i];
40                      node->ls = (long) -1;
                        node->os = (long) -1;
                        node->ns = (long) -1;
                        node->related proc = NIL(RELPROC);
                        sp[i]—>type = VAR;
45                      /*
                         * add to btree
                         */
                        (void) search(sp[i]->name, signals, &h, &u, (char**) &node, PUT );
                if ( h ) {
50                              /*
                                 * tree is higher
                                 */
                                q = signals;
                                signals = (PAGE *) malloc( (unsigned) sizeof( PAGE ) );
55                              if ( signals == NIL(PAGE) ) {
                                        return( -1 );
                                }
                                signals->m = 1;
                                signals->p0 = q;
60                              signals->e[1].key = u.key;
```

```
                signals->e[l].addr = u.addr;
                signals->e[l].p = u.p;
            }
        }
        proc->sense_list[i] = node;
        /*
        *search for definition
        */
        for ( rp = node->related_proc; rp; rp = rp->next )
            if ( rp->po == proc ) {
                got_it = 1;
                break;
            }
        if ( !got_it ) {
            rp — (RELPROC *) malloc ( sizeof ( RELPROC ) );
            if ( rp == NIL (RELPROC) ) {
                return( -1 );
            }
            rp->po = proc;
            rp->next = node->related_proc;
            node->related_proc = rp;
        }
    }
    return( 0 );
}

/*
*set_last_state
*
*/
private int set_last_state( key, node )
char *key;
SOBJ *node;
{
long val;
long fetch_value( );

val = fetch_value( node->s );
        if ( node->ls != val ) {            /* if new state */
            node->ls = val;
            node->os = val;
            node->ns = val;
        }
        else {                              /* no change */
            node->ls = val;
            node->os = val;
            node->ns = val;
        } return( 0 );

}
/*
*set_new_state
*
*/
private int set_new_state( key, node )
```

```
        char *key;
        SOBJ *node;
        {
        int j;
   5    RELPROC *p;
        long val;
        long fetch_value( );

val = fetch_value( node->s );
  10                    /*
                         * value has changed
                         */
                        if ( ( val != node->ns ) ) {
                                node->ls = !node->ns;        /* last state not new state */
  15                                                         /* need to show the edge */
                            /*
                             * set the new state to current state
                             */
                            if ( node->s->relatives ) {
  20                                kin_assign( node->s, (float) node->ns );
                            }
                            else {
                                    node->s->u.val = (float) node->ns;
                            }
  25                        /*
                             * notify all processes of change
                             */
                            for ( p = node->related_proc; p; p = p->next ) {
                                    for ( j = 0; j < p->po->count; j++ ) {
  30                                        /*
                                             * process is sensitive to this node
                                             */
                                            if ( p->po->sense_list[j] == node ) {
                                                    new_state = 1;
  35                                                stable = 0;
                                                    p->po->changed_state[j] = 1;
                                                    break;
                                            }
                                    }
  40                        }
                        } return( 0 );
        }
  45
        /*
         * set_old_state
         *
         */
  50    private int set_old_state( key, node )
        char *key;
        SOBJ *node;
        {
        long fetch_value( );
  55
                /*
                 * save the current state before propagating a process
                 */
                node->os = (long) fetch_value( node->s );
  60            return( 0 );
```

```
}
/*
 * set_start_state
 *
 */
private int set_start_state( key, node )
char *key;
SOBJ *node;
{
RELPROC *p;
int j;
int notify;
long val;
long fetch_value( );

if ( node->ls != (long) (val = fetch_value( node->s )) ) {
                /*
                 * node has changed
                 */
                if ( node->ls == -1 ) {
                        node->ls = !val;           /* initialize the context */
                }
                node->ns = (long) val;             /* initialize the context */
                stable = 0;
                if ( is_sig_enabled( 1, node->s ) )
                        node->s->driven = 1;       /* node is driven externally */
                else
                        node->s->driven = 0;
                notify = 1;
        } else {
                node->os = val;
                node->ns = val;
                notify = 0;
        }

/*
         * notify all processes of change
         */
        for ( p = node->related proc; p; p = p->next ) {
                for ( j = 0; j < p->po->count; j++ ) {
                        /*
                         * process is sensitive to this node
                         */
                        if ( p->po->sense list[j] == node ) {
                                p->po->changed state[j] = notify;
                                p->po->save state[j] =
                                        (!notify) ? val : p->po->save state[j];
                                break;
                        }
                }
        } return( 0 );
}

/*
 * set_next_state
```

```
 *
 */
*/ private int set_next_state( key, node )
char *key;
SOBJ *node;
{
RELPROC *p;
int j;
long val;
long fetch_value( );

/*
         * current process has propagated a node
         */
        if ( node->os != (long) (val = fetch_value( node->s )) ) {
                val = fetch_value( node->s );
                if ( node->os != -1 ) {
                        /*
                         * set node to next state
                         */
                        node->ns = val;
                        /*
                         * set the current state
                         */
                        if ( node->s->relatives ) {
                                kin_assign( node->s, (float) node->os );
                        }
                        else {
                                node->s->u.val = (float) node->os;
                        }
                }
                else {
                        /*
                         * initialize context
                         */
                        node->os = !val;
                        node->ns = val;
                }
                /*
                 * notify all processes of change
                 */
                for ( p = node->related_proc; p; p = p->next ) {
                        for ( j = 0; j < p->po->count; j++ ) {
                                if ( p->po->sense_list[j] == node ) {
                                        stable = 0;
                                        p->po->changed_state[j] = 1;
                                        break;
                                }
                        }
                }
        }
        return( 0 );
}

/*
 * propagate( )
 *
 */
private int propagate( key, proc )
char *key;
```

```
        POBJ *proc;
        {
        int i;
        int evaluate;
   5    int ier = 0;
        int abort = 0;
        long val;
        long fetch_value( );

10            evaluate = 0;

/*
                 * for all this process' sensitive nodes
                 * determine which ones have a valid change
  15             * to evaluate. Be sure to set the state
                 * so the proper edge of a signal is showing
                 */
                for ( i = 0; i < proc->count; i++ ) {
                        val = fetch_value( proc->sense_list[i]->s );
  20                    if ( proc->changed_state[i] ) {
                                /*
                                 * this node has changed
                                 */
                                evaluate = 1;
  25
                                if ( proc->sense_list[i]->ls == -1 )
                                        proc->sense_list[i]->ls = !val;
                                else
                                        proc->save_state[i] = proc->sense_list[i]->ls;
  30                    }
                        else {
                                /*
                                 * this node has not
                                 */
  35                            proc->save_state[i] = proc->sense_list[i]->ls;
                                proc->sense_list[i]->ls = val;
                        }
                }

40            if ( evaluate ) {
                        /*
                         * save the current state of all sensitive nodes
                         */
                        ier = allelements( signals, set_old_state );
  45                    if ( ier != 0 ) {
                                return( ( ier == 1 ) ? 0 : ier );
                        }

/*
  50                     * need to execute the process
                         */
                        ier = execprocess( proc->process, 0, &abort );
                        if ( ier != 0 ) {
                                return( ier );
  55                    }
                        else if ( abort ) {
                                return( 1 );
                        }
                }
  60            /*
```

```
                    update this process' list of changed nodes
                    * in the sensitivity list
                    */
                    for ( i = 0; i < proc->count; i++ ) {
 5                          if ( proc->changed_state[i] ) {
                                  proc->changed_state[i] = 0;
                                  /*
                                   * set back the before state of the signals edge
                                   */
10                                proc->sense_list[i]->ls = proc->save_state[i];
                            }
                    } if ( evaluate ) {
15                  /*
                     * set the next state of all sensitive nodes
                     */
                    ier = allelements( signals, set_next_state );
                    if ( ier != 0 ) {
20                          return( ( ier == 1 ) ? 0 : ier );
                    }
            }
            return( ier );
    }
25
    /*
     * simulate
     *
     */
30  int simulate( )
    {
    int race = 0;
    int internal_race = 0;
    int ier = 0;
35  int abort = 0;

stable = 0;                              /* not stable yet ...
         .*/

40                  /*
                     * set the start state of all sensitive nodes
                     * set_start_state may determine we are stable
                     */
                    ier = allelements( signals, set_start_state );
45                  if ( ier != 0 ) {
                            return( ( ier == 1 ) ? 0 : ier );
                    } while ( !stable ) {
50
                            /*
                             * we are not stable yet! ... execute all processes
                             */
                            stable = 1;
55                          new_state = 1;
                            internal_race = 0;

/*
                             * while there are new states to propagate
60                           */
```

```
        while ( new_state ) { new_state = 0;

/*
             * for each process propagate if needed?
             */
            ier = allelements( processes, propagate );
            if ( ier != 0 ) {
                    return( ( ier == 1 ) ? 0 : ier );
            }
            /*
             * set the new state if any? of all sensitive nodes
             */
            ier = allelements( signals, set_new_state );
            if ( ier != 0 ) {
                    return( ( ier == 1 ) ? 0 : ier );
            } if ( internal_race >= 100 ) {
                    stable = 1;
                    break;
            }
            internal_race++;
        }
        if ( race >= 100 ) {
                stable = 1;
        }
        race++;
    }
    /*
     * processes are stable . . . set the last state to show propagation
     */
    ier = allelements( signals, set_last_state );
    if ( ier != 0 ) {
            return( ( ier == 1 ) ? 0 : ier );
    } return( ier );
}
```

What is claimed is:

1. A logic simulator for simulating the operation of a logic network in a computer system, said logic simulator comprising:

means for defining a plurality of signals using state information associated with each signal of said plurality of signals in an execution cycle, said state information including a definition of a current state of a current execution cycle and a prior state of a prior execution cycle of each signal of said plurality of signals;

means for defining a logic process associated with a group of said plurality of signals, said logic process having input corresponding to one or more signal inputs of said group of said plurality of signals associated with said logic process, said logic process having output corresponding to one or more signal outputs of said group of said plurality of signals associated with said logic process, said logic process including simulation logic defining a relationship between said input of said logic process and said output of said logic process, said simulation logic further including a definition of interconnections between signals of said group of signals associated with said logic process;

means for defining sensitivity information including a definition of which of said plurality of signals affect said output of said logic process;

means for applying input signals to said input of said logic process;

means for executing in successive execution cycles said simulation logic of said logic process to produce output signals on said output of said logic process, said means for executing further including means for updating said state information;

means for executing in successive execution cycles only said simulation logic associated with a signal specified in said sensitivity information that has changed state since said signal was last evaluated or that has an unknown prior state;

means for determining if said output of said logic process is either no longer changing state or changing state in a predictable manner thereby indicating that the logic process is stable; and means for continuing to propagate, evaluate and update said simulation logic in successive execution cycles until said output of said logic process is either no longer changing state or changing state in a predictable manner thereby indicating that the logic process is stable.

2. The logic simulator as claimed in claim 1 wherein said state information includes information specifying whether each signal of said plurality of signals has changed state since each signal was last evaluated in said prior execution cycle.

3. The logic simulator as claimed in claim 1 further including means for setting a start state of each signal of said plurality of signals.

4. The logic simulator as claimed in claim 1 wherein said means for determining further includes means for determining if said output of said logic process has changed state since said output was last evaluated in said prior execution cycle.

5. The logic simulator as claimed in claim 1 wherein said means for determining further includes means for determining if a signal specified in said sensitivity information has changed state since said output was last evaluated in said prior execution cycle.

6. The logic simulator as claimed in claim 1 wherein said means for executing further includes means for executing simulation logic associated only with a signal specified in said sensitivity information that has changed state from a previous execution cycle.

7. The logic simulator as claimed in claim 1 wherein said logic process includes a definition of precedence among signals within said group of said plurality of signals in one execution cycle.

8. A process for simulating the operation of a logic network in a computer system, said process comprising the steps of:

defining a plurality of signals using state information associated with each signal of said plurality of signals in an execution cycle, said state information including a definition of a current state in a current execution cycle and a prior state of a prior execution cycle of each signal of said plurality of signals:

defining a logic process associated with a group of said plurality of signals, said logic process having input corresponding to one or more signal inputs of said group of said plurality of signals associated with said logic process, said logic process having output corresponding to one or more signal outputs of said group of said plurality of signals associated with said logic process, said logic process including simulation logic defining a relationship between said input of said logic process and said output of said logic process, said simulation logic further including a definition of interconnections between signals of said group of signals associated with said logic process;

defining sensitivity information including a definition of which of said plurality of signals affect said output of said logic process;

applying input signals to said input of said logic process;

executing said simulation logic in successive execution cycles of said logic process to produce output signals on said output of said logic process, said step of executing further including a step of updating said state information;

executing only said simulation logic in successive execution cycles associated with a signal specified in said sensitivity information that has changed state since said signal was last evaluated or that has an unknown prior state;

determining if said output of said logic process is either no longer changing state or changing state in a predictable manner thereby indicating that the logic process is stable; and continuing to propagate, evaluate and update said simulation logic in successive execution cycles until said output of said logic process is either no longer changing state or changing state in a predictable manner thereby indicating that the logic process is stable.

9. The process as claimed in claim 8 wherein said state information includes information specifying whether each signal of said plurality of signals has changed state since each signal was last evaluated in said prior execution cycle.

10. The process as claimed in claim 8 further including a step of setting a start state of each signal of said plurality of signals.

11. The process as claimed in claim 8 wherein said step of determining further includes a step of determining if said output of said logic has changed since said output was last evaluated in said prior execution cycle.

12. The process as claimed in claim 8 wherein said step of determining further includes a step of determining if a signal specified in said sensitivity information has changed state since said signal was last evaluated in said prior execution cycle.

13. The process as claimed in claim 8 wherein said logic process includes a definition of precedence among signals within said group of said plurality of signals in one execution cycle.

* * * * *